US010321608B1

(12) United States Patent
Beall et al.

(10) Patent No.: US 10,321,608 B1
(45) Date of Patent: Jun. 11, 2019

(54) COORDINATED COOLING USING RACK MOUNTABLE COOLING CANISTERS

(71) Applicant: Amazon Technologies, Inc., Seattle, WA (US)

(72) Inventors: Christopher Strickland Beall, Woodinville, WA (US); Felipe Enrique Ortega Gutierrez, Tacoma, WA (US); Darin Lee Frink, Lake Tapps, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 14/968,757

(22) Filed: Dec. 14, 2015

(51) Int. Cl.
*H05K 7/20* (2006.01)
(52) U.S. Cl.
CPC .................. *H05K 7/20736* (2013.01)
(58) Field of Classification Search
CPC .......... H05K 7/20181; H05K 7/20736; H05K 7/20145; H05K 7/20618; G06F 1/20; G06F 1/206
See application file for complete search history.

(56) References Cited

U.S. PATENT DOCUMENTS

| | | | | |
|---|---|---|---|---|
| 4,860,163 A | * | 8/1989 | Sarath | H05K 7/20563 361/695 |
| 5,414,591 A | * | 5/1995 | Kimura | G06F 1/20 361/679.33 |
| 5,871,396 A | | 2/1999 | Shen | |
| 6,042,348 A | * | 3/2000 | Aakalu | F04D 25/14 361/695 |
| 6,181,557 B1 | * | 1/2001 | Gatti | H05K 7/20618 165/122 |
| 6,259,605 B1 | | 7/2001 | Schmitt | |
| 6,545,850 B1 | | 4/2003 | Shearman et al. | |
| 6,603,661 B2 | | 8/2003 | Smith et al. | |
| 6,621,693 B1 | | 9/2003 | Potter et al. | |
| 6,675,976 B2 | | 1/2004 | Steinman et al. | |
| 6,702,665 B1 | * | 3/2004 | Tai | G06F 1/206 361/695 |

(Continued)

OTHER PUBLICATIONS

U.S. Appl. No. 14/876,597, filed Oct. 6, 2015, Darin Lee Frink.

(Continued)

*Primary Examiner* — David M Sinclair
*Assistant Examiner* — Theron S Milliser
(74) *Attorney, Agent, or Firm* — Robert C. Kowert; Meyertons, Hood, Kivlin, Kowert & Goetzel, P.C.

(57) ABSTRACT

A cooling canister includes a canister body with an opening in the canister body that is configured to couple with a corresponding opening in a canister body of an adjacent cooling canister in a rack. Servers are coupled with the cooling canister and a set of fans are coupled with the cooling canister. The cooling canister provides at least partial airflow isolation between an airflow through the set of servers coupled with the cooling canister and other airflows through other servers in the rack. In the event of a control anomaly, such as a fan failure, the opening in the canister body of the cooling canister is configured to permit airflow between the cooling canister and an adjacent cooling canister to supplement an airflow through the cooling canister. In some embodiments, a dampers is included in the opening in the canister body of the cooling canister.

21 Claims, 16 Drawing Sheets

(56) References Cited

U.S. PATENT DOCUMENTS

| | | | |
|---|---|---|---|
| 6,791,836 B2 | 9/2004 | Cipolla et al. | |
| 6,795,314 B1 | 9/2004 | Arbogast et al. | |
| 6,822,859 B2 | 11/2004 | Coglitore et al. | |
| 6,957,544 B2* | 10/2005 | Dobbs | F24F 11/053 |
| | | | 165/80.3 |
| 7,031,154 B2 | 4/2006 | Bash et al. | |
| 7,042,722 B2 | 5/2006 | Suzuki et al. | |
| 7,061,715 B2* | 6/2006 | Miyamoto | G06F 1/20 |
| | | | 360/99.25 |
| 7,068,509 B2 | 6/2006 | Bash et al. | |
| 7,139,170 B2* | 11/2006 | Chikusa | G06F 1/20 |
| | | | 165/122 |
| 7,238,104 B1* | 7/2007 | Greenslade | G06F 1/20 |
| | | | 361/695 |
| 7,283,358 B2 | 10/2007 | Campbell et al. | |
| 7,379,299 B2 | 5/2008 | Walsh et al. | |
| 7,403,390 B2 | 7/2008 | Franz et al. | |
| 7,599,183 B2 | 10/2009 | Dittus et al. | |
| 7,660,116 B2 | 2/2010 | Claassen et al. | |
| 7,701,710 B2* | 4/2010 | Tanaka | G11B 33/142 |
| | | | 312/223.2 |
| 7,719,835 B1 | 5/2010 | Schluter | |
| 7,862,410 B2* | 1/2011 | McMahan | H05K 7/20736 |
| | | | 454/184 |
| 7,869,210 B2 | 1/2011 | Moss | |
| 7,916,471 B2* | 3/2011 | Miyamoto | G11B 33/128 |
| | | | 361/679.31 |
| 7,990,700 B2 | 8/2011 | Guo | |
| 8,403,736 B2* | 3/2013 | Rasmussen | H05K 7/20572 |
| | | | 361/695 |
| 8,472,183 B1 | 6/2013 | Ross et al. | |
| 8,477,491 B1* | 7/2013 | Ross | H05K 7/20736 |
| | | | 361/679.48 |
| 8,638,553 B1* | 1/2014 | Czamara | H05K 7/20736 |
| | | | 361/679.48 |
| 8,720,532 B2* | 5/2014 | Malone | H05K 7/20727 |
| | | | 165/121 |
| 8,755,192 B1* | 6/2014 | Schrempp | G06F 1/20 |
| | | | 361/679.5 |
| 8,897,006 B2* | 11/2014 | Ito | G06F 1/183 |
| | | | 361/679.48 |
| 9,049,802 B2* | 6/2015 | Yi | H05K 7/20709 |
| 2002/0145853 A1* | 10/2002 | Grouell | H05K 7/2019 |
| | | | 361/695 |
| 2004/0032722 A1* | 2/2004 | Wrycraft | H05K 7/1488 |
| | | | 361/725 |
| 2004/0218355 A1 | 11/2004 | Bash | |
| 2004/0233643 A1 | 11/2004 | Bolich et al. | |
| 2004/0252456 A1* | 12/2004 | Larson | G06F 1/20 |
| | | | 361/694 |
| 2005/0166860 A1 | 8/2005 | Austin et al. | |
| 2005/0168942 A1* | 8/2005 | Steinbrecher | H05K 7/20209 |
| | | | 361/690 |
| 2005/0237716 A1* | 10/2005 | Chu | H05K 7/20745 |
| | | | 361/696 |
| 2006/0274496 A1 | 12/2006 | Lee | |
| 2007/0127207 A1* | 6/2007 | Katakura | G11B 33/12 |
| | | | 361/694 |
| 2008/0013275 A1 | 1/2008 | Beckley et al. | |
| 2008/0112127 A1 | 5/2008 | June | |
| 2008/0285232 A1 | 11/2008 | Claassen | |
| 2009/0086441 A1 | 4/2009 | Randall et al. | |
| 2009/0262499 A1* | 10/2009 | Chou | H05K 7/20172 |
| | | | 361/695 |
| 2010/0085707 A1* | 4/2010 | Moss | H05K 7/20836 |
| | | | 361/695 |
| 2010/0321874 A1* | 12/2010 | Bhattacharyya | H05K 7/20736 |
| | | | 361/679.5 |
| 2012/0069514 A1* | 3/2012 | Ross | H05K 7/20727 |
| | | | 361/679.33 |
| 2012/0092811 A1 | 4/2012 | Chapel et al. | |
| 2012/0133255 A1* | 5/2012 | Izuno | H05K 7/20727 |
| | | | 312/236 |
| 2012/0247750 A1* | 10/2012 | Kobayashi | H05K 7/20836 |
| | | | 165/287 |
| 2013/0056090 A1* | 3/2013 | Tang | G06F 1/20 |
| | | | 137/215 |
| 2013/0155608 A1* | 6/2013 | Tang | G06F 1/20 |
| | | | 361/679.48 |
| 2015/0036284 A1* | 2/2015 | Ross | G06F 1/20 |
| | | | 361/679.46 |
| 2015/0036287 A1* | 2/2015 | Ross | H05K 7/20736 |
| | | | 361/679.48 |

OTHER PUBLICATIONS

International Search Report for PCT/US2011/051139, dated Dec. 6, 2011, Amazon Technologies, Inc., pp. 1-10.
U.S. Appl. No. 12/886,440, filed Sep. 20, 2010, Peter G. Ross.
U.S. Appl. No. 12/886,472, filed Sep. 20, 2010, Peter G. Ross.
U.S. Appl. No. 12/886,469, filed Sep. 20, 2010, Peter G. Ross.
Office Action from U.S. Appl. No. 12/886,437, dated May 29, 2012, Peter G. Ross, pp. 1-7.
U.S. Appl. No. 12/886,437, filed Sep. 20, 2010, Peter G. Ross.
Office Action from U.S. Appl. No. 12/886,440, dated May 30, 2012, Peter G. Ross, pp. 1-8.
Office Action from U.S. Appl. No. 12/886,472, dated May 30, 2012, Peter G. Ross, pp. 1-8.
By Kurt W. Roth, Ph.D., et al., "Electronically Commutated Permanent Magnet Motors," published in ASHRAE Journal, Mar. 2004. © Copyright 2004 American Society of Heating, Refrigerating and Air-Conditioning Engineers, Inc., pp. 75-76.
U.S. Appl. No. 14/876,602, filed Oct. 6, 2015, Peter G. Ross, et al.
U.S. Appl. No. 14/868,280, filed Sep. 28, 2015, Peter G. Ross, et al.
U.S. Appl. No. 13/874,367, filed Dec. 18, 2013, Peter G. Panchapakesan et al.
U.S. Appl. No. 14/876,602, filed Oct. 6, 2015, Darin Lee Frink.
Clad Metal from Engineered Materials Solutions, "How Thermostat Metal Works," downloaded from http://www.emsclad.com/tech.html/ on Aug. 3, 2015, pp. 1-6.
Robertshaw Industrial Products Division, "Instruction Manual No. P-2057," Feb. 1991, pp. 1-8.
Intertek, "Instruction Sheet for FC-2-215-1C," Middle Atlantic Products, Rev D, downloaded from http://images2.cableorganizer.com/midatlantic/fc-fan-control-units/FC-2-215-1C.pdf on Sep. 12, 2015, pp. 1-4.

* cited by examiner

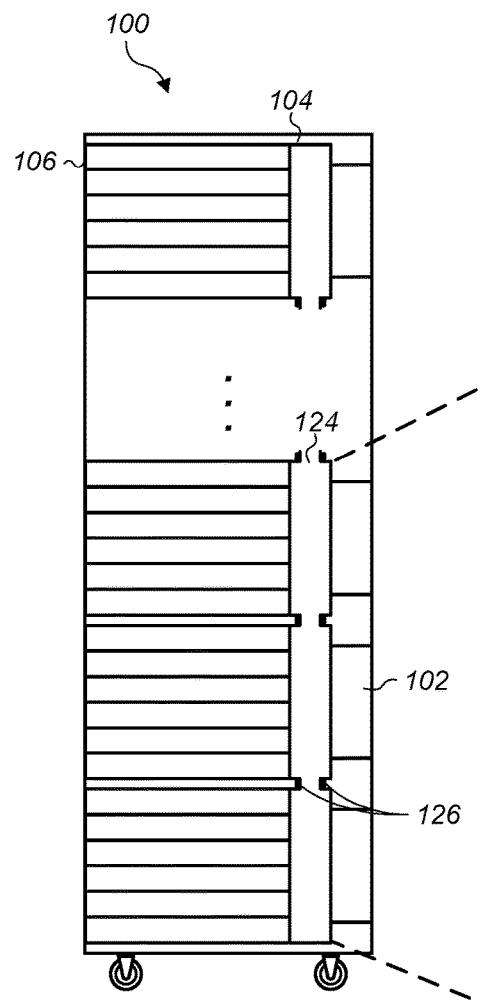 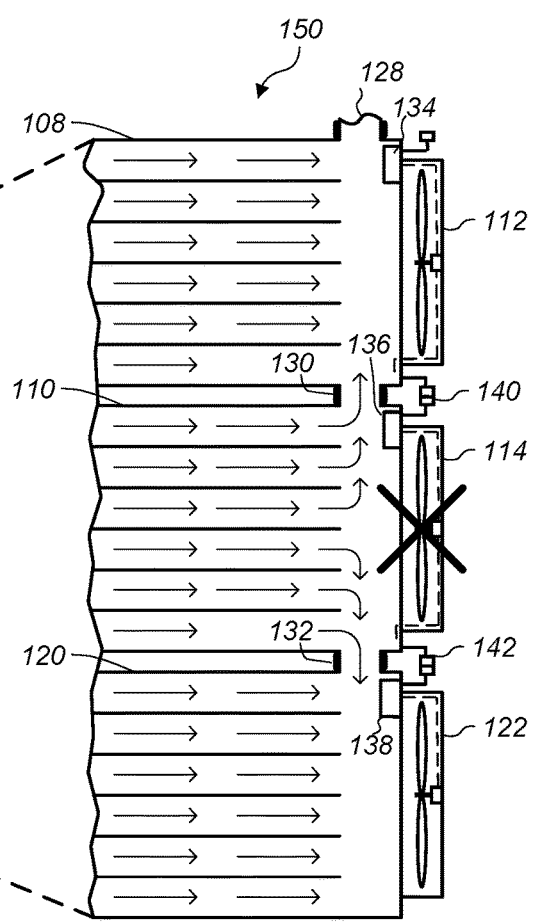
FIG. 1A
FIG. 1B

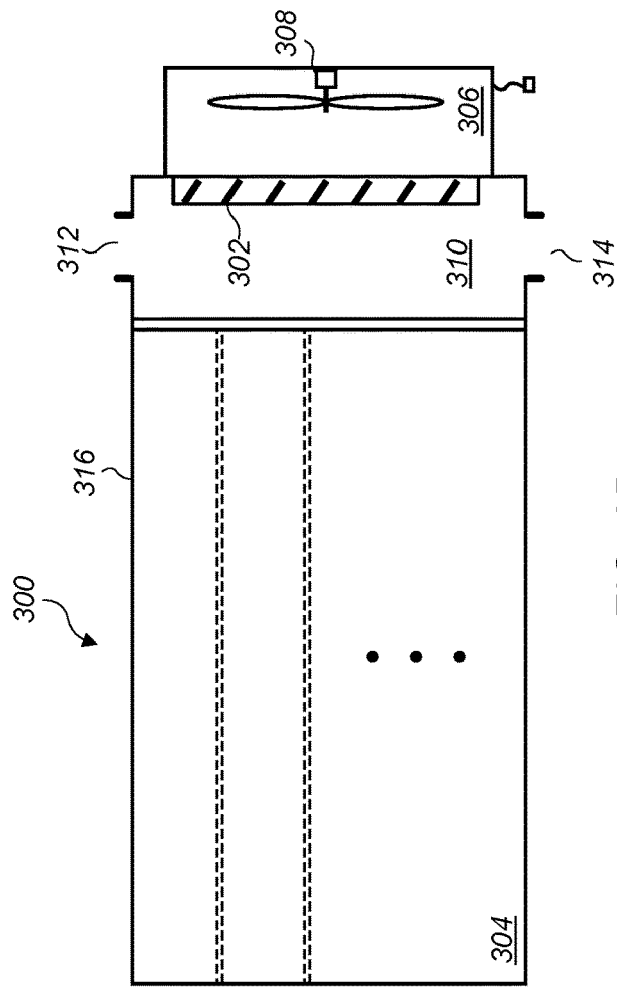
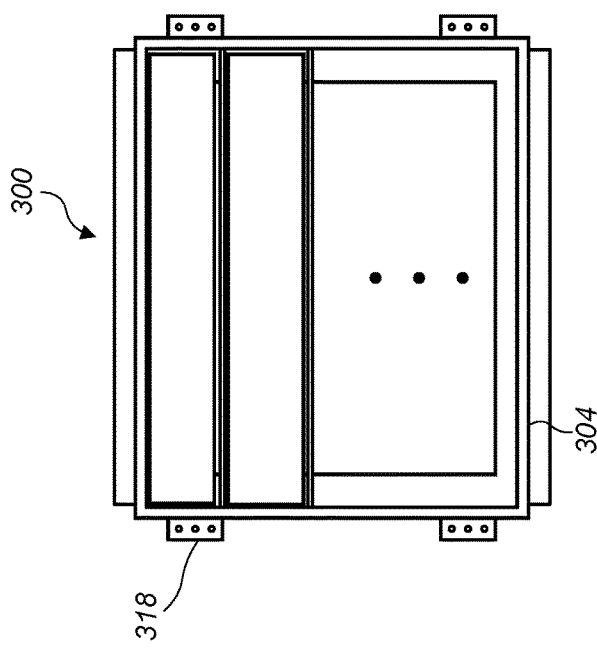
FIG. 3B
FIG. 3A

COORDINATED COOLING USING RACK MOUNTABLE COOLING CANISTERS

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computing systems typically include a number of components that generate waste heat. Such components include printed circuit boards, mass storage devices, power supplies, and processors. For example, some computers with multiple processors may generate 250 watts of waste heat. Some known computing systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Computing systems mounted in a rack may include one or more fans mounted in individual computing systems to cool components of the computing systems. Such arrangements may lead to inefficiencies because the computing systems include a large number of relatively small fans that are inefficient when compared to larger fans. Also, the large number of fans mounted in individual computing systems may operate such that some of the fans produce airflows that impede airflows from others of the fans.

Some racks may include rack level fans used to cool computer systems mounted in a rack. However, some rack level fans may also lead to inefficiencies in cooling computing systems mounted in a rack. For example, rack level fans may be controlled at a rack level such that all computer systems mounted in the rack receive a similar amount of air flow. In such an arrangement, the rack level fans may be controlled based on a highest measured temperature from a computer system mounted in a rack and therefore provide surplus cooling to other computer systems mounted in the rack that are operating at lower temperatures or the rack level fans may control based on some other configuration and not provide adequate cooling to computer systems that are operating at temperatures greater than other computer system mounted in the rack. Furthermore, air passages in a rack, such as wire access openings, mounting holes, etc., may provide leak paths for air flows generated by rack level fans such that a portion of the air flows generated by rack level fans is lost to air leaks and is not used to cool computer systems mounted in the rack.

BRIEF DESCRIPTION OF THE DRAWINGS

FIG. 1A illustrates a rack comprising a plurality of servers and a plurality of cooling canisters, according to some embodiments.

FIG. 1B illustrates a cut-away view of a portion of a rack comprising a plurality of servers and a plurality of cooling canisters, according to some embodiments.

FIG. 3A illustrates a front view of a server containment section of a cooling canister, according to some embodiments.

FIG. 3B illustrates a side view of a cooling canister, according to some embodiments.

Figure 1C:
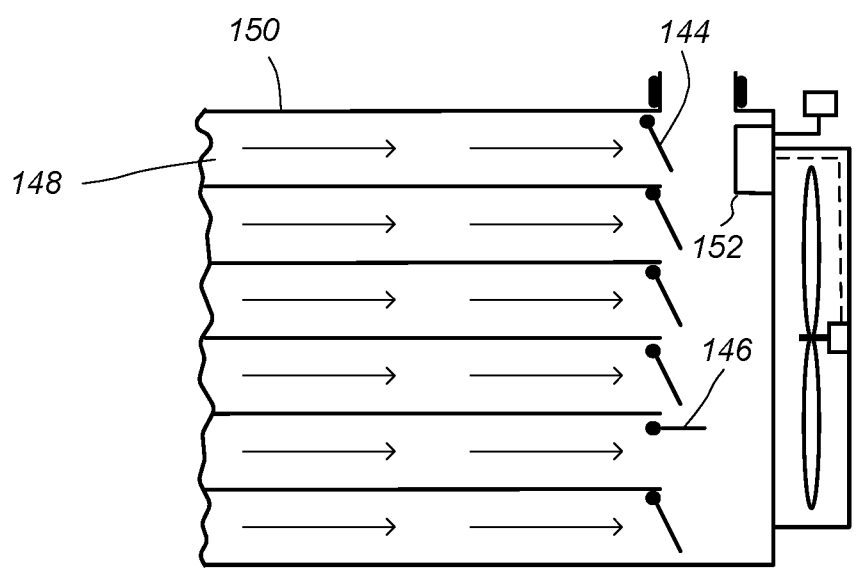
FIG. 1C illustrates a cut-away view of a portion of a cooling canister, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular forms disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of cooling canisters, and systems and methods for utilizing cooling canisters, are disclosed. According to at least one embodiment, a computing system comprises a rack, multiple servers, multiple cooling canisters mounted in the rack, and a plurality of fans. Individual ones of the cooling canisters include a canister body configured to couple with a subset of the servers such that air flowing through the subset of servers flows through the canister body. Individual ones of the cooling canisters also include a respective opening in a respective canister body of the individual cooling canister that is configured to couple with a corresponding opening in a canister body of an adjacent cooling canister mounted in the rack. For example, two adjacent cooling canisters mounted in a rack may be connected via openings that form an air passage between the two canisters that permits air to flow between the two adjacent cooling canisters. In the computing system, separate ones of the cooling canisters are coupled with respective sets of fans, wherein at least one of the sets of fans is configured such that, in the case of one or more fans of the set of fans not being in operation, an inadequate quantity of air is directed through a corresponding cooling canister coupled with the set of fans. However, the opening in the canister body of the corresponding cooling canister is configured to permit a supplemental flow of air between the corresponding cooling canister and an adjacent cooling canister with an opening coupled with the opening of the corresponding cooling canister such that an adequate quantity of air is directed through the corresponding cooling canister to cool the subset of servers coupled to the corresponding cooling canister. For example, a cooling canister may be coupled with a set of two fans that direct air to flow through a subset of servers mounted in the cooling canister. One of the two fans coupled to the cooling canister may fail resulting in an inadequate quantity of air being directed through the subset of servers and a supplemental flow of air may flow through the cooling canister via an opening in a body of the cooling canister that is coupled with an opening in a body of an adjacent cooling canister such that an adequate quantity of air is directed through the cooling canister to cool the subset of servers mounted in the cooling canister. In some embodiments, dampers may be mounted in the opening of the cooling canister to adjust a quantity of air that flows through the cooling canister via the opening coupled with the adjacent cooling canister.

According to some embodiments, a cooling canister includes a canister body configured to couple with a subset of a plurality of servers mounted in a rack such that air flowing through the subset of servers flows through the canister body. The cooling canister also includes an opening in the canister body configured to couple with a corresponding opening in a canister body of an adjacent cooling canister. The opening in the canister body of the cooling canister is configured to permit air to flow between the cooling canister and the adjacent cooling canister.

According to some embodiments, a method includes coupling a canister body of a first cooling canister in a first rack position such that air that flows through a set of servers in the first rack position flows through the canister body of the first cooling canister. The method also includes coupling a canister body of a second cooling canister in a second rack position such that air that flows through an additional set of servers in the second rack position flows through the canister body of the second cooling canister. The method further includes aligning an opening in the canister body of the first cooling canister with an opening in the canister body of the second cooling canister, such that the aligned openings permit airflow between the first cooling canister and the second cooling canister to compensate for an air flow deficit in an airflow through the first cooling canister or through the second cooling canister.

According to some embodiments, a computing system includes multiple cooling canisters mounted in a rack. Individual ones of the cooling canisters include a canister body configured to couple with a subset of servers in the rack such that air flowing through the subset of servers flows through the canister body and an opening in the canister body configured to couple with a corresponding opening in a canister body of an adjacent cooling canister. The opening in the canister body is configured to permit airflow between the cooling canister and the adjacent cooling canister. The computing system also includes a plurality of fans, wherein respective ones of the cooling canisters are configured to couple with respective sets of one or more fans of the plurality of fans. The computing system also includes a plurality of cooling controllers configured to control the respective sets of fans. Individual ones of the cooling controllers are configured to receive one or more condition signals indicating thermal conditions in a given subset of servers, wherein the cooling controller is configured to control a given respective set of fans of the plurality of fans that is coupled with a cooling canister that is coupled with the given subset of servers and generate control signals for controlling the given respective set of fans. For a given cooling canister and an adjacent cooling canister, two or more of the cooling controllers controlling respective sets of fans coupled with the given cooling canister and the adjacent cooling canister are configured to coordinate control of the respective sets of fans to control an amount of air that flows between the given cooling canister and the given adjacent cooling canister via the openings in the canister bodies of the given cooling canister and the given adjacent cooling canister. For example, in the case of one of the fans of a set of fans coupled with a cooling canister failing, a cooling controller controlling the set of fans may coordinate with a cooling controller controlling a set of fans coupled with an adjacent cooling canister to cause supplemental air to flow into the cooling canister coupled with the failed fan via the opening in the canister body of the cooling canister that is coupled with the opening in the canister body of the adjacent cooling canister.

According to some embodiments, a method includes receiving one or more condition signals indicating thermal conditions in a set of servers coupled with a cooling canister, wherein the cooling canister comprises one or more openings in a canister body of the cooling canister, wherein at least one of the one or more openings in the canister body of the cooling canister is coupled with an opening in a canister body of an adjacent cooling canister. The method also includes determining coordinated control outputs for controlling a set of fans coupled to the cooling canister that are coordinated with another set of fans coupled to the adjacent cooling canister, wherein the coordinated control outputs adjusts an amount of air to flow between the cooling canister and the adjacent cooling canister via the at least one opening in the canister body of the cooling canister and the opening in the canister body of the adjacent cooling canister. The method further includes generating control signals for controlling the set of fans coupled to the cooling canister in accordance with the determined control outputs.

According to some embodiments, a non-transitory computer-readable storage medium stores program instructions that when executed implement a cooling controller. The cooling controller is configured to receive one or more condition signals indicating thermal conditions in a set of servers coupled with a cooling canister, wherein the cooling canister comprises one or more openings in a canister body of the cooling canister, wherein at least one of the one or more opening in the canister body of the cooling canister is coupled with an opening in a canister body of an adjacent cooling canister. The cooling controller is also configured to determine coordinated control outputs for controlling a set of fans coupled to the cooling canister that are coordinated with another set of fans coupled to the adjacent cooling canister and generate control signals for controlling the set of fans coupled to the cooling canister in accordance with the determined coordinated control outputs.

As used herein, "air moving device" includes any device, element, system, or combination thereof that can move air. Examples of air moving devices include fans, blowers, and compressed air systems.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computer system" or "computing system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, to "direct" air includes directing or channeling air, such as to a region or point in space. In various embodiments, air movement for directing air may be induced by creating a high pressure region, a low pressure region, or a combination both. For example, air may be directed downwardly within a chassis by creating a low pressure region at the bottom of the chassis. In some embodiments, air is directed using vanes, panels, plates, baffles, pipes or other structural elements.

As used herein, a "rack" means a rack, container, frame, or other element or combination of elements that can contain or physically support one or more computer systems.

As used herein, a "space" means a space, area or volume.

As used herein, a "slot" means a space in a rack configured to accept a device that is to be installed in the rack. Examples of a slot in a rack include a shelf in a rack on which computing devices can be mounted or a pair of rails in a rack on which computing devices can be mounted.

In some embodiments, various components are mounted in a rack such as separate computer systems, devices, etc. Such separate computer systems, devices, etc. may include heat-producing components cooled via airflows through a rack. Such separate computer systems and devices can include one or more data storage modules, data control modules, etc. In some embodiments, each of the data storage modules and data control modules in a rack include one or more heat producing components. Such separate computer systems and devices may include data processing modules, network devices, etc. In some embodiments, each of the processing modules or network devices may include heat producing components, such as processors, switches, etc.

In some embodiments, one or more air moving devices, such as fans, may direct an airflow through one or more of the computer systems or devices mounted in a rack to remove heat from heat producing components of the computer systems or devices mounted in the rack. Air moving devices mounted in individual computer systems or individual devices in a rack may be less efficient at cooling the individual computer systems or individual devices than larger shared air moving devices used to cool multiple computer systems or multiple devices. For example, shared air moving devices may include larger fans and motors that cause an equivalent amount of airflow as multiple smaller air moving devices while consuming less energy than the multiple smaller air moving devices.

Computer systems and devices mounted in a rack may generate varying amounts of waste heat. For example, a particular computer system mounted in a rack may experience a high processing load that causes the computer system to generate a large amount of waste heat while another computer system mounted in the same rack may be experiencing a minimal processing load. The amount of waste heat generated by the other computer system may be considerably less than the amount of waste heat generated by the particular computer system. Shared rack-level air moving devices that supply a shared airflow to the particular computer system and the other computer system may be controlled such that the amount of airflow generated by the shared rack-level air moving devices is sufficient to cool the particular computer system experiencing the high processing load. However, the shared rack-level air moving devices may supply more airflow than is necessary to cool the other computer system experiencing the minimal processing load. The surplus airflow supplied to the other computer system experiencing the minimal load may lead to wasted energy because energy is consumed by the shared rack-level air moving devices to generate the surplus airflow even though the surplus airflow is not necessary to cool the other computer system. Greater efficiencies may be realized by at least partially isolating subsets of computer systems from other subsets of computer systems mounted in a rack such that separate subsets of computer systems are cooled by separate shared air moving devices. Also, air plenums through which air flows that is used to cool computer systems mounted in racks may include leak paths such as holes for mounting brackets, holes where wires enter or leave a rack, or other types of leak paths. Air flowing out of air plenums via leak paths may also lead to wasted energy.

In addition, from time to time, air moving devices, such as fans, that direct air flows through computer systems to cool the computer systems may fail. In order to at least partially isolate subsets of computer systems cooled by separate shared air moving devices, while still being able to remove adequate amounts of heat energy from the subsets of computer systems during a failure of an air moving device cooling the subsets of computer systems, adjacent cooling canisters that at least partially isolate subsets of computer systems may be connected via openings in respective bodies of the adjacent cooling canisters. The coupled openings may connect plenums formed by separate cooling canisters to form a "super plenum." In some embodiments, dampers may be included in an opening of a cooling canister that is configured to couple with a corresponding opening in an adjacent cooling canister. The dampers may facilitate at least partial isolation of air flows between the adjacent cooling canisters under normal operating conditions and may open under abnormal conditions to allow air to flow between the adjacent cooling canisters to supplement an air flow in one or the other of the adjacent cooling canisters. In some embodiments, openings in canister bodies of adjacent cooling canisters in a rack may not include dampers. The openings in the canister bodies of the adjacent cooling canisters may be sized in a way that balances air flow isolation with redundancy (e.g. the ability to flow air between cooling canisters in the case of an air moving device failure). For example, an opening in a cooling canister body may be sized so that under normal operating conditions there is a minimal amount of air flow through the opening that is coupled with a corresponding opening in an adjacent cooling canister, but during an abnormal operating condition, such as a fan failure, air may flow through the opening to supplement a lost quantity of air flow due the failed fan.

FIG. 1A illustrates a rack comprising a plurality of servers and a plurality of cooling canisters, according to some embodiments. A cooling canister may mount in a rack and include rails or shelves for mounting computer systems, such as servers, in the cooling canister. In some embodiments, a cooling canister may mount in a space in a rack adjacent to a subset of servers mounted in the rack and couple with the subset of servers. A cooling canister may facilitate air flow isolation between subsets of servers and reduce leak paths for air flowing through the subsets of servers. A cooling canister may include a canister body that couples with a subset of servers of a plurality of servers mounted in a rack and a sealing surface that seals the canister body with the subset of servers such that the cooling canister facilitates a partial air flow isolation for air flow flowing through the subset of servers mounted in the rack. In some embodiments, multiple cooling canisters may be mounted in a rack to facilitate partial airflow isolation through multiple respective subsets of servers mounted in the rack. A cooling canister coupled to a subset of servers in a rack may form an air plenum for the subset of servers coupled to the canister body of the cooling canister. Openings in canister bodies of adjacent cooling canisters may be aligned and coupled to form a "super plenum" that connects respective plenums in the adjacent cooling canisters.

In some embodiments, a cooling canister mounted in a rack may couple with one or more fans of a set of fans that draw air through the subset of servers via an air plenum formed by the cooling canister. In some embodiments a cooling canister may be coupled to an air inlet end of a subset of servers and form an air plenum between fans that direct air into the subset of servers and the subset of servers.

In some embodiments, a cooling canister may include an opening in a canister body of the cooling canister downstream from servers mounted in the cooling canister. The opening in the canister body may be configured to couple with an opening in a canister body of an adjacent cooling canister. In some embodiments, a sealing surface, such as a gasket may be included around the periphery of an opening in a cooling canister to seal the opening with an opening in an adjacent cooling canister.

For example, FIG. 1A illustrates a rack comprising a plurality of servers and a plurality of cooling canisters, according to some embodiments. Server rack 100 in FIG. 1A includes servers 106, cooling canisters 104 mounted in rack 100, and air moving devices 102 coupled with cooling canisters 104. In some embodiments, a server rack in which cooling canisters are mounted is a standard 19" server rack, for example server rack 100 may be a standard 19" rack. In some embodiments, the servers in the server rack, such as servers 106, may be standard sized servers. In some embodiments, a cooling canister may be mounted in a space in a standard rack with standard sized servers without modifying the servers or the rack. In some embodiments, a cooling canister may be mounted in a non-standard size rack. Air moving devices may couple with a cooling canister to cause air to flow through a subset of servers coupled with a cooling canister. For example, FIG. 1A illustrates air moving devices 102 coupled to cooling canisters 104. In some embodiments, air moving device may be mounted on a cooling canister and in some embodiments air moving devices may be separate from a cooling canister and couple with a cooling canister when the cooling canister is installed in a rack. For example, air moving devices 102 may be mounted to a structure of cooling canisters 104. In some embodiments, air moving devices may be mounted to a door of a rack, such as rack 100, and couple with cooling canisters mounted in the rack, such as cooling canisters 104 mounted in rack 100, when a door of the rack is closed.

A cooling canister may be mounted in a rack comprising computer systems of various sizes. For example, a cooling canister may couple with a subset of servers mounted in a rack that includes half-width servers. A cooling canister mounted in a rack may also couple with a subset of servers that includes servers with heights that are non-standard. For example a cooling canister may couple with servers that have heights of 1.5U, 1.66U, 2U, 2.5U, 3U, or other non-standard server heights. In another example, a cooling canister may couple with servers that have widths such that 1, 2, 3, or more servers are arranged along a width of a standard 19" slot. FIG. 1A illustrates subsets of servers that include six vertically arranged servers per cooling canister. However, in some embodiments a subset of servers coupled with a cooling canister may include more or less servers.

A cooling canister may couple with or include shared air moving devices that generate an air flow that cools multiple servers in a subset of servers coupled to the cooling canister. Shared air moving devices may be larger and therefore more efficient than smaller air moving devices included in individual servers. In some embodiments, air moving devices, such as air moving devices 102, may have a diameter of 200 millimeters or greater. In some embodiments, air moving devices, such as air moving devices 102, may be electrically commutated fans. In some embodiments air moving devices, such as air moving devices 102, may include other types of fans, such as DC fans or AC fans. In some embodiments air moving devices, such as air moving devices 102, by have diameters that are greater or smaller than 200 mm. For example an air moving device may include a set of smaller fans that span multiple 1U rack slots in a rack.

A cooling canister may include an opening that couples with an opening of an adjacent cooling canister to form a "super plenum" or an air plenum that connects multiple cooling canisters. For example, cooling canisters 104 includes openings 124. In some embodiments, a sealing surface such as a foam gasket or other suitable sealing material may seal openings of adjacent cooling canisters that are coupled together. For example openings 124 of cooling canisters 104 are sealed via sealing surface 126.

A "super plenum" may enable a set of servers coupled with a cooling canister to receive adequate air flow during a fan failure or a control anomaly event.

For example, FIG. 1B illustrates a cut-away 150 of a portion of rack 100 that includes three cooling canisters 104 (cooling canisters 108, 110, and 120 in FIG. 1B). Servers 106 are coupled to cooling canisters 108, 110, and 120 and air moving devices 112, 144, and 122 are coupled to cooling canisters 108, 110, and 120. A "super plenum" 128 is formed by coupled openings 130 and 132 between adjacent cooling canisters 108, 110, and 120. In some embodiments, air moving devices 112, 114, and 122 may be mounted to cooling canisters 108, 110, and 120. Air moving devices 112, 114, and 122 include sets of one or more fans. The fans included in air moving devices 112, 114, and 122 are configured to generate respective shared air flows that are shared between subsets of servers 106 coupled with cooling canisters 108, 110, and 120.

Air moving devices coupled with a cooling canister that generate an airflow shared by a subset of sevsers coupled with the cooling canister may provide sufficient air flow and cooling for the subset of servers coupled to the cooling canister such that air flow from air moving devices or fans mounted in individual servers is not needed to cool the individual servers. For example, sets of fans in air moving devices 112, 114, and 122 may generate sufficient air flow through servers 106 coupled with cooling canisters 108, 110, and 120 such that fans mounted within servers 106 are not needed to cool servers 106. In some embodiments, servers, such as servers 106, may not include fans, and may rely on air flows generated by air moving devices coupled to a cooling canister to provide cooling to the servers, such as air moving devices 112, 114, and 122.

Also, air moving devices coupled to separate cooling canisters may be independently controlled and separate cooling canisters may facilitate partial air flow isolation such that air flows through a first subset of servers coupled to a first cooling canister flows at a particular rate and such that air flows through a second subset of servers coupled to a second cooling canister at a second rate that is different than the first rate. For example, air moving device 112 may cause air to flow through a subset of servers 106 coupled to cooling canister 108 at a first rate and air moving device 114 may cause air to flow through a separate subset of servers 106 coupled to cooling canister 110 at a second rate that is different than the first rate at which air flows through the subset of servers 106 coupled to cooling canister 108.

However, openings in a canister body of a cooling canister may allow air to flow between adjacent cooling canisters to provide air flow redundancy in the case of an inadequate airflow through one of the cooling canisters. In some embodiments, an opening may be sized to at least partially isolate air flows between adjacent cooling canisters such that the adjacent cooling canisters are configured to flow air at different rates, but also be sized so that if a pressure difference between the adjacent cooling canisters becomes large enough, an adequate amount of air flows between the adjacent cooling canisters via the openings in the canister bodies of the adjacent cooling canisters to allow an air flow through one of the adjacent cooling canisters to supplement an air flow through the other one of the adjacent cooling canisters.

In FIG. 1B one of the fans in air moving device 114 is not in operation. Due to the loss of one of the fans in air moving device 114, an inadequate amount of airflow is being generated by air moving device 114 to properly cool servers 106 of cooling canister 110 coupled with air moving device 114. However, supplemental air flows are supplied to cooling canister 110 via coupled openings 130 and 132. As can be seen by the arrows in FIG. 1B, air is drawn out of cooling canister 110 and into cooling canister 108 via coupled openings 130 and an air pressure differential created by air moving device 112. Also, as seen in FIG. 1B, air is drawn out of cooling canister 110 and into cooling canister 120 via coupled openings 132 and an air pressure differential created by air moving device 122. In some embodiments, coupled openings 130 and 132 may include dampers to adjust air flow between adjacent cooling canisters 108, 110, and 122.

A cooling canister may include a cooling controller that controls fan speeds and/or damper positions. For example, cooling canister 108 includes cooling controller 134, cooling canister 110 includes cooling controller 136, and cooling canister 120 includes cooling controller 138. A cooling controller may receive control signals from another source and relay the control signals to air moving devices. For example cooling controller 136 may receive a control signal from one of servers 106 and relay the control signal to air moving device 114. In some embodiments, a cooling controller may receive measurements associated with a subset of servers coupled with a cooling canister and generate a control signal to control one or more air moving devices coupled to a cooling canister associated with the cooling controller. For example, controller 136 may receive one or more measurement signals relating to measurements of a subset of servers 106, such as temperature, power consumption, processing load, etc. and determine an output signal to control air moving device 114 based on the measurement signals.

A cooling canister may include one or more connectors configured to couple with connectors of an adjacent cooling canister. The connectors may allow cooling controllers of adjacent cooling canisters to communicate with each other. For example, coupled connectors 140 allow cooling controller 134 of cooling canister 108 to communicate with cooling controller 136 of cooling canister 110. Also, coupled connectors 142 allow cooling controller 136 of cooling canister 110 to communicate with cooling controller 138 of cooling canister 120. In some embodiments, a cooling controller may receive signals from a cooling controller of an adjacent cooling canister and may determine coordinated control outputs that coordinate the operation of a set of fans coupled with the cooling canister with operation of a set of fans coupled with an adjacent cooling canister.

In some embodiments a cooling controller may be included in an air moving device instead of being included in a cooling canister. For example, cooling controller 134 may be included in air moving device 112 instead of being included in cooling canister 108. In some embodiments a cooling controller may be separate from a cooling canister and one or more air moving devices coupled to the cooling canister. For example, a cooling controller may be implemented on a server mounted in a rack, such as one of servers 106. In some embodiments, a cooling controller may be implemented by a remote system such as a central control system or building management system that controls multiple air moving devices on multiple racks and may route a control signal to the air moving devices via network infrastructure associated with servers 106. For example a central control system may route control signals over a network to one or more servers, such as one or more of servers 106, or a top of rack switch associated with a rack, such as rack 100, and one or more links may communicate the control signal from the one or more servers or the top of rack switch to a particular air moving device that is to be controlled. Control schemes for controlling for controlling air moving devices coupled to cooling canisters is discussed in more detail below in regard to FIG. 7. Any of the control schemes described below in regard to FIG. 7 may be employed in an arrangement such as that depicted in FIGS. 1A and 1B.

In some embodiments, servers, such as servers 106 mount within a cooling canister on shelves or rails of the cooling canister. In some embodiments, cooling canisters may be configured to mount in a rack while servers mounted in the rack are in operation. For example, rack 100 may include a back door. The back door may be opened while servers 106 are in operation and cooling canisters 104 may be positioned in a space in rack 100 adjacent to servers 106 while servers 106 are in operation. After cooling canisters 104 are mounted in rack 100, the back door of rack 100 may be closed.

In some embodiments, a cooling canister may include slot level dampers associated with server slots in the cooling canister. Slot level dampers associated with server slots may adjust an amount of air that is drawn through the server that corresponds with the slot level damper. The further the damper opens, a greater volume of air may be drawn through a corresponding server slot of the cooling canister by an air moving device coupled with the cooling canister. The further the damper closes, a lesser volume of air may be drawn through a corresponding server slot of the cooling canister by an air moving device coupled with the cooling canister. In some embodiments, dampers may be controlled by a cooling controller associated with the cooling canister. In some embodiments, a thermally responsive material, such as a shape memory alloy (e.g. Nitinol) or a wax motor, may cause slot level dampers of a cooling canister to automatically adjust positions based on a temperature of air flowing out of a corresponding slot.

For example, FIG. 1C illustrates a cut-away view of a portion of a cooling canister, according to some embodiments. In FIG. 1C, dampers 144 are associated with each of slots 148 of cooling canister 150. Cooling controller 152 may generate control signals for controlling dampers 144. In some embodiments, a cooling controller, such as cooling controller 144, may coordinate control of slot level dampers with dampers in openings in the cooling canister that are configured to couple with adjacent cooling canisters. In response to a particular server generating more waste heat than other servers of a cooling canister, a slot level damper associated with that server may be instructed by a cooling controller to open more than other slot level dampers in the cooling canister. For example, cooling controller 152 may generate control signals that cause damper 146 to open more than the other dampers 144 in cooling canister 150. Any of the cooling canisters 104 described in FIGS. 1A-B may include slot level dampers as described in FIG. 1C. Cooling controller 144 may be any of the cooling controllers 134, 136, and 138 described in FIGS. 1A-1B.

Figure 2:
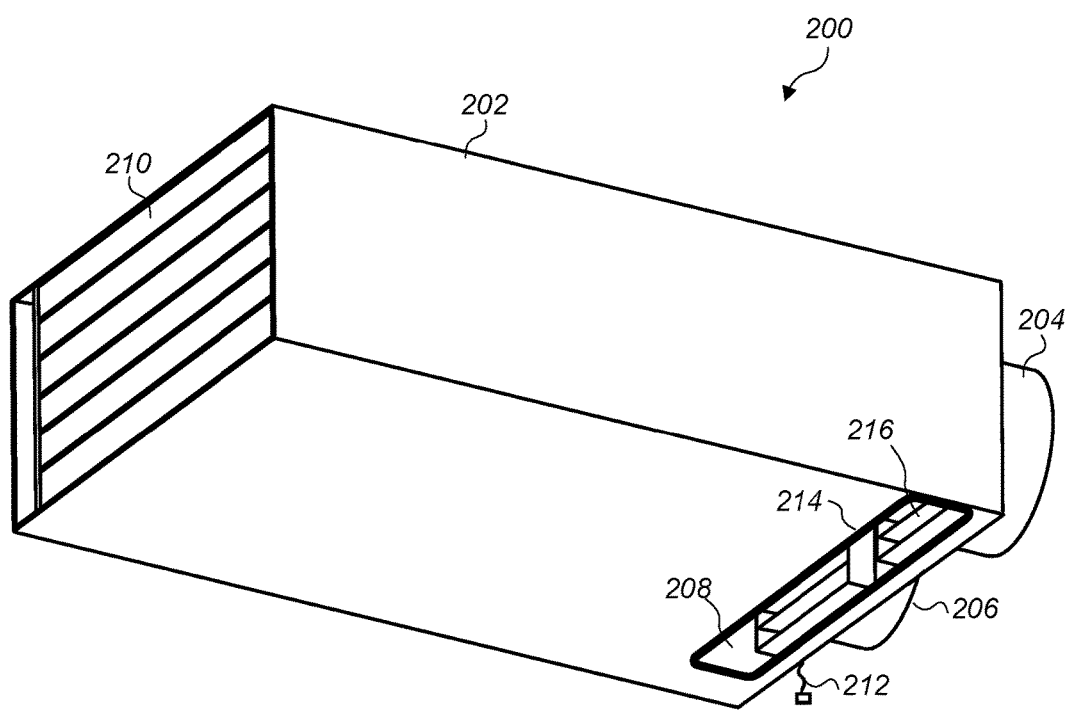
FIG. 2 illustrates a perspective view of a cooling canister, according to some embodiments.

FIG. 2 illustrates a perspective view of a cooling canister, according to some embodiments. Cooling canister 200 illustrated in FIG. 2 may be a cooling canister 104 as illustrated in FIG. 1. Six servers 210 are mounted within cooling canister 200. In some embodiments, servers, such as servers 210 may be mounted in a cooling canister via shelves of the cooling canister or rails of the cooling canister. Also fans 204 and 206 may be included in an air moving device that is coupled with a cooling canister such as air moving device 112, 114, or 122 described in FIG. 1. Cooling canister 200 includes canister body 202 and fans 204 and 206. In some embodiments, fans 204 and 206 may be separate from cooling canister 200 and couple with cooling canister 200 when cooling canister 200 is installed in a rack. In some embodiments a cooling canister may be configured to accept five to seven 1U servers (or servers of various sizes that are equivalent to 5 to 7 1U servers) and couple with two fans. In some embodiments more or less servers may be mounted in a cooling canister and a cooling canister may couple with more or less fans. The fans coupled with a cooling canister, such as fans 204 and 206, may be configured such that in the case of one or more of the fans not being in operation an inadequate quantity of air is directed through the servers mounted in the cooling canister, such as servers 210.

In some embodiments air moving devices such as fans 204 and 206 may be large (e.g. 200 millimeter or larger) electrically commutated fans. Large electrically commutated fans may provide better efficiency than similarly sized DC fans. Also large fans may provide greater efficiency than multiple smaller fans.

A cooling canister may include an opening in a canister body of the cooling canister that permits air to flow between the cooling canister and an adjacent cooling canister when there is not an adequate flow or air through one of the cooling canister or the adjacent cooling canisters to cool a set of servers mounted in the one of the cooling canister or the adjacent cooling canisters. For example, cooling canister 200 includes opening 208 in canister body 202. Sealing surface 214 is mounted along the periphery of opening 208 and is configured to form a seal with an adjacent cooling canister when mounted in a rack with the adjacent cooling canister.

In some embodiments, a canister body of a cooling canister, such as canister body 202 of cooling canister 200 may be a contiguous structure configured to accept a subset of servers mounted in a rack and configured to couple with air moving devices. The contiguous structure of a canister body may form an airtight air plenum between a subset of servers and one or more air moving devices and facilitate an airflow isolation for an airflow generated by the one or more air moving devices. A cooling canister may also include an opening, such as opening 208, that couples with an adjacent cooling canister to form a super plenum. The super plenum may be isolated from ambient conditions so that air drawn out of the super plenum by air moving devices, such as air moving devices 204 and 206, flows through one or more cooling canisters that form part of the super plenum. As described above, rack level shared fans may lose efficiency due to various leak paths in a rack housing. However, a cooling canister with a contiguous structure may not include leak paths commonly found in a rack housing because the cooling canister mounts in the rack and couples with one or more air moving devices without a need for wires to pass through the cooling canister, mounting brackets to be affixed to the cooling canister, or other such items to be included in the cooling canister that may cause leak paths in a rack housing.

In some embodiments, a cooling canister may include recirculation prevention louvers, such as louvers 216. Recirculation prevention louvers may be designed to prevent recirculation of air through an opening for a fan when the fan is not in operation. For example, if fan 204 were to fail louvers 216 associated with fan 204 would fall closed to prevent fan 206 from pulling air through the opening for fan 204 instead of pulling air from within cooling canister 200. In some embodiments, recirculation prevention louvers, such as louvers 216 may be gravity operated, so that when a fan is in operation, a low pressure created by the fan pulls the louvers open and keeps the louvers open while the fan is in operation. When the fan ceases to create the low pressure, the force of gravity may cause the louvers to fall shut and thus prevent recirculation.

In some embodiments, a cooling canister, such as cooling canister 200 may include a wired connector configured to couple with a connector of an adjacent cooling canister. For example, cooling canister 200 includes connector 212. In some embodiments a wired connector, such as connector 212, may be an RJ45 connector or other suitable connector for transmitting data between cooling canisters. Adjacent cooling canisters may include cooling controllers that are communicatively coupled via wired connectors and communicate with each other via the wired connectors.

FIG. 3A illustrates a front view of a server containment section of a cooling canister and FIG. 3B illustrates a side view of a cooling canister that includes recirculation prevention louvers, according to some embodiments. System 300 includes cooling canister 304 and air moving device 306. Air moving device 306 includes recirculation prevention louvers 302. In some embodiments, air moving device 306 may be mounted to cooling canister 304. In FIG. 3B, an end-view of system 300 illustrates an example arrangement of fans 308 in air moving device 306. In some embodiments, individual components of an air moving device, such as fans 308, may be hot-pluggable. A hot-pluggable component, such as fans 308, may be removed while other ones of the components, such as particular ones of fans 308, remain in operation. For example, one of fans 308 may be removed from air moving device 306 mounted to cooling canister 304 while remaining ones of fans 308 remain in operation and provide cooling to a subset of servers coupled to cooling canister 304. Recirculation prevention louvers, such as recirculation prevention louvers 302, may prevent recirculation and cooling bypass when a fan is not in operation or is removed. For example, when a fan is not in operation a portion of air generated by a remaining fan may be drawn into the suction of the fan and thus create a recirculation loop that bypasses the intended path for air generated by the fan, such as cooling a subset of servers coupled with a cooling canister. A recirculation prevention louver may be made of a light-weight material that is held open by air pressure generated from fans that are in operation and that falls closed when a fan is not generating an airflow. Gravity and an air-pressure differential across either side of a set of recirculation prevention louvers may cause the recirculation prevention louvers to fall closed when a fan that corresponds with the set of recirculation prevention louvers is not in operation. By falling closed, when air is not flowing through a particular fan, a recirculation prevention louver may isolate a flow path through the openings associated with the fan that is not generating airflow and therefore prevent recirculation and cooling bypass. For example, in the case of one of fans 308 not being in operation, recirculation prevention louvers 302 may prevent air flowing through common air plenum 310 from recirculating through the opening for the one of fans 308 that is not in operation.

As illustrated in FIG. 3B, one or more openings in a canister body of a cooling canister may be located in a portion of the canister body of the cooling canister that encompasses a common air plenum. For example, openings 312 and 314 are located in a part of canister body 316 that encompasses common air plenum 310. In some embodiments, a cooling canister may include an opening in a top surface of the canister body, such as opening 312 and an opening in a bottom surface of the canister body such as opening 314. Cooling canisters with multiple openings may be coupled with an opening of an adjacent cooling canister above the cooling canister and may be coupled with another adjacent cooling canister below the cooling canister in a rack. In some embodiments, a cooling canister may include an opening in a top surface but not in a bottom surface of a canister body of the cooling canister. Also, in some embodiments a cooling canister may include an opening in a bottom surface of the cooling canister but not in the top surface of the cooling canister.

In some embodiments, cooling canister may be incrementally installed in a rack. For example, cooling canisters with only one opening may be installed as an upper most and a lower most cooling canister in a rack. As additional computing capacity is required, additional cooling canisters that include sets of servers may be mounted in the rack between the upper most and the lower most cooling canisters that only include one opening. In some embodiments, an upper most or lower most cooling canister may be modified to include an additional opening and another cooling canister with a single opening may be mounted above or below the modified cooling canister. In some embodiments, an upper most or lower most cooling canister may be repositioned in a rack to allow space for an additional cooling container to be installed between an upper most and lower most cooling container.

In some embodiments, a rack may include multiple sets of coupled cooling canisters that form separate super plenums. For example, a rack may include an upper most cooling canister with an opening in a bottom surface of a canister body of the upper most cooling canister. The upper most cooling canister may be coupled with one or more cooling canisters with openings in both an upper surface and a bottom surface of a canister body of the cooling canisters. Below the one or more cooling canisters with two openings, another cooling canister with an opening in a top surface of a body of the cooling canister may be coupled with a bottom one of the one or more cooling canisters with two openings. Below the bottom canister with one opening, other rack systems such as power supplies, network switches, etc. may be installed in the rack but not configured to be cooled by air flowing through the cooling canisters mounted above. Another similar set of cooling canisters may be mounted in the rack below the other rack systems. Such an arrangement may result in a set of cooling canisters being coupled together to form a super plenum in one section of a rack and another set of cooling canisters being coupled together to form another super plenum in a different section of a rack.

In some embodiments, fans, such as fans 308 of air moving device 306, may be mounted at an angle or tilted. Installing fans in a tilted arrangement may improve fan efficiently because an exhaust side of a tilted fan may experience less resistance to flow than a perpendicularly mounted fan. For example, in some embodiments, racks may be organized in a data center in aisles, such that a back side of one row of racks face a backside of another row of racks in an adjacent aisle. Heated exhaust air from a rack may be directed into a hot aisle between rows of racks. The heated exhaust air in a hot aisle may be drawn into a cooling system from vents above or below the hot aisle. Fans tilted at an angle may direct exhaust air up towards a vent in a hot aisle or down towards a vent below a hot aisle such that the exhausted air is pulled into the vent. By directing the exhaust air in a direction of a hot aisle vent an airflow from a fan may experience less impedance from airflows from other servers exhausting air into the hot aisle.

Also, tilted fans may facilitate service and maintenance of an air moving devices. For example, fans 308 may be mounted at an angle such that a fan in the top row of fans 308 on air moving device 306 can slide out in front of a fan on a lower row of fans 308 on air moving device 306.

In some embodiments, a cooling canister may include mounting brackets configured to couple with a chassis of a rack and support a canister body of the cooling canister when the cooling canister is mounted in the rack. For example, cooling canister 304 includes mounting brackets 318.

FIG. 3B illustrates an air moving device that includes two fans mounted next to each other horizontally (so that only one fan is visible in the side view). In some embodiments, an air moving device may include other quantities and arrangements of fans. For example, in some embodiments, an air moving device may include a single large fan, or other fan arrangements, such as arrangements of three fans, etc.

Any of the air moving devices or fans described in FIGS. 1-14 may include recirculation prevention louvers or tilted fans, as described in regard to FIGS. 3A and 3B.

FIGS. 4A-D illustrate cooling canisters with openings in canister bodies of the cooling canisters, according to some embodiments.

An opening in a canister body of a cooling canister that is configured to couple with a similar sized opening in an adjacent cooling canister may be sized (along with the opening in the adjacent cooling canister) to balance an amount of air that flows between the cooling canister and the adjacent cooling canister and an amount of air flow isolation between the cooling canister and the adjacent cooling canister. For example, a cooling canister that couples with a set of three fans may require a smaller opening to support air flow in the case of a failure of one of the three fans than a cooling canister that couples with a set of two larger fans. In some embodiments, a cooling canister may include multiple openings on a same surface (e.g. top surface, bottom surface, or side surface) of the cooling canister.

Figure 4A:
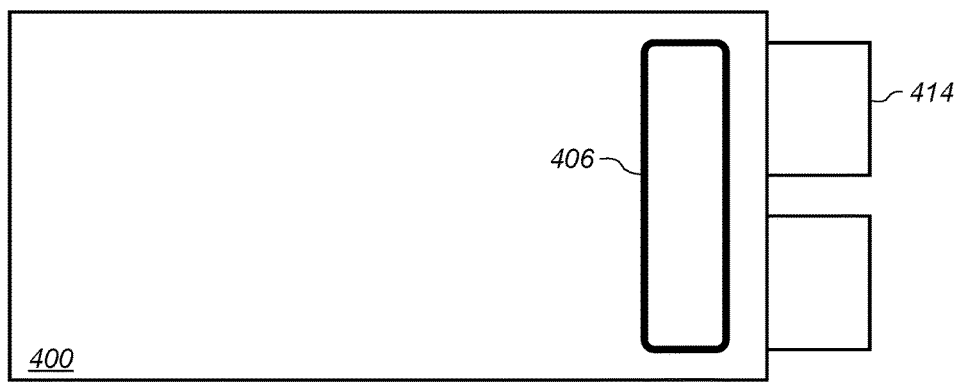
FIG. 4A illustrates a cooling canister with an opening in a canister body of the cooling canister, according to some embodiments.
Figure 4B:
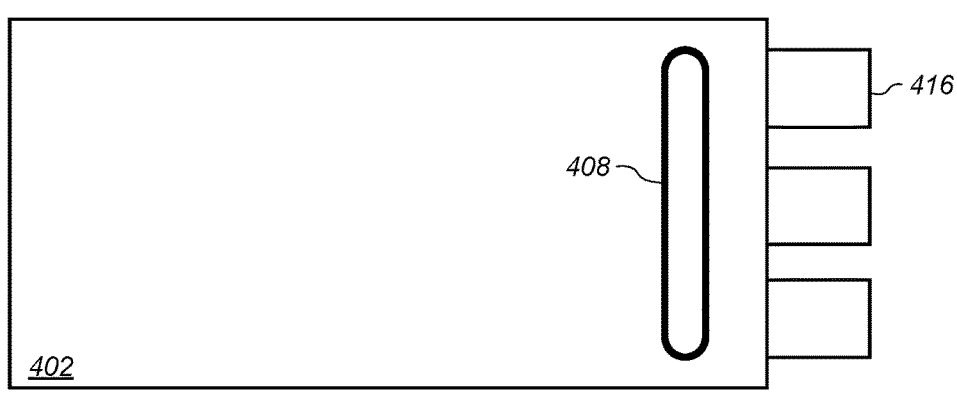
FIG. 4B illustrates a cooling canister with an opening in a canister body of the cooling canister, according to some embodiments.

For example, FIG. 4A illustrates cooling canister 400 that includes opening 406 in a bottom surface or a top surface of a canister body of cooling canister 400. Two fans 414 couple with cooling canister 400. FIG. 4B illustrates a cooling canister 402 that includes an opening 408 that is smaller than the opening 406 in cooling canister 400 of FIG. 4A. FIG. 4B illustrates three fans 416 coupled with cooling canister 402. Because each fan of the three fans 416 coupled with cooling canister 402 is responsible for a smaller portion of the air flow generated through cooling canister 402 than the two fans illustrated in FIG. 4A coupled with cooling canister 400, in the event of a failure of one of the three fans 416, a smaller air flow deficit will result. Therefore, cooling canister 402 in FIG. 4B may require a smaller opening to allow sufficient supplemental air to flow between adjacent cooling canisters in the event of a failure of one of the three fans 416 coupled with cooling canister 402 that opening 406 in cooling canister 400.

Figure 4C:
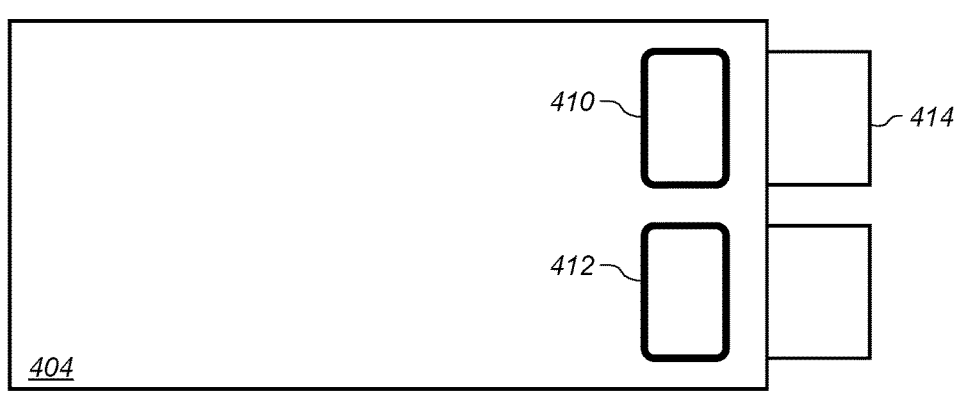
FIG. 4C illustrates a cooling canister with multiple openings in a canister body of the cooling canister, according to some embodiments.

FIG. 4C illustrates a cooling canister 404 that includes two openings (e.g. opening 410 and 412) in a canister body of cooling canister 404 on a same surface of the canister body (e.g. top surface or bottom surface). In some embodiments, a damper may be located in an opening of a cooling canister. The damper may remain closed under normal operating conditions and may open in response to an anomaly in control of air flow through a cooling canister. For example, a damper may open in response to a fan failure. A cooling canister with multiple openings in a same surface of cooling canister may include dampers that are configured such that one damper may open when a fan that corresponds with an opening including the damper fails, but another damper may remain closed. For example, one of fans 414 coupled with cooling canister 404 may fail and in response, a damper in opening 410 may open while a damper in opening 412 remains closed.

Figure 4D:
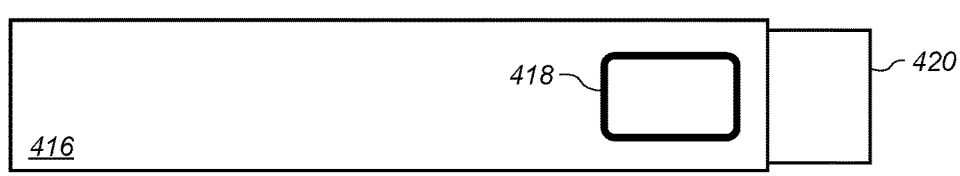
FIG. 4D illustrates a cooling canister with an opening in a side surface of a canister body of the cooling canister, according to some embodiments.

FIG. 4D illustrates a cooling canister 416 that includes an opening 418 in a side surface of a canister body of cooling canister 416. In some embodiments, an opening in a side surface of a cooling canister may couple with an opening in a cooling canister in an adjacent rack that is in a rack position that corresponds with the rack position of the cooling canister. An opening in a side surface of a cooling canister may enable cooling canisters in adjacent racks to couple together to form "super plenums" across racks. In some embodiments, a damper may be included in an opening in a side surface of a canister body of a cooling canister.

In some embodiments, a cooling canister may include only an opening in a top surface, bottom surface, or side surface of the cooling canister. In some embodiments, a cooling canister may include various combinations of openings in any of a top surface, a bottom surface, or multiple side surfaces.

Figure 5A:
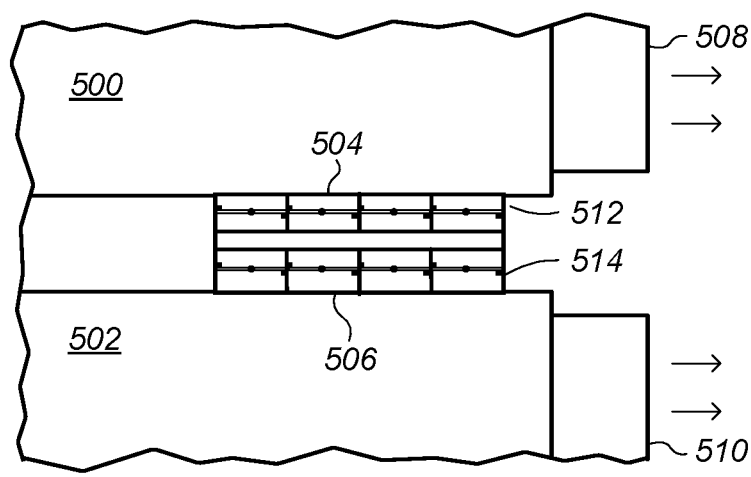
FIG. 5A illustrates a cutaway of a cooling canister that includes dampers in an opening in a canister body of the cooling canister, according to some embodiments.
Figure 5B:
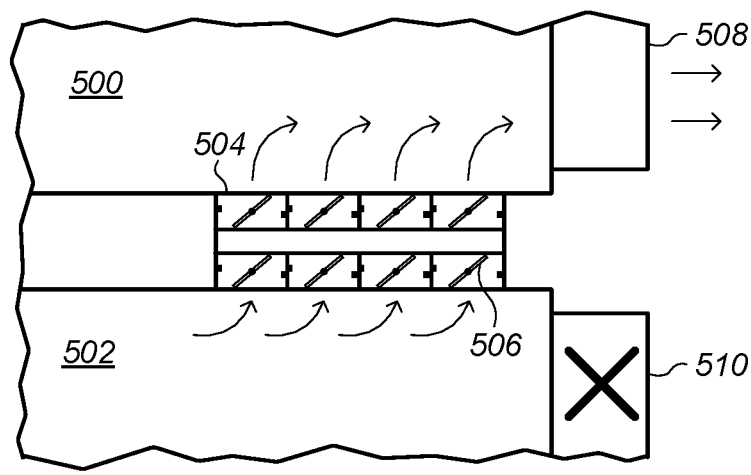
FIG. 5B illustrates a cutaway of a cooling canister that includes dampers in an opening in a canister body of the cooling canister, according to some embodiments.

FIGS. 5A-5B illustrate cutaways of a cooling canister that includes dampers in an opening in a canister body of the cooling canister, according to some embodiments. FIG. 5A illustrates adjacent cooling canisters 500 and 502. Opening 512 in a canister body of cooling canister 502 is coupled with opening 514 in a canister body of cooling canister 502. Sets of dampers 512 and 514 are located in respective ones of openings 512 and 514. Fans 508 are coupled with cooling canister 500 and direct a flow or air through cooling canister 500 and a set of servers (not shown) coupled with cooling canister 500. Fans 510 are coupled with cooling canister 502 and direct a flow of air through cooling canister 502 and a set of servers (not shown) coupled with cooling canister 502. In FIG. 5A both fans 508 and 510 are in normal operation and are directing air through cooling canisters 500 and 502. In some embodiments, dampers 504 and 506 are configured to remain closed while fans 508 and 510 are in normal operation and are configured to open in response to abnormal operations, such as a fan failure or a control anomaly. A control anomaly may include one set of servers cooled by a set of fans operating at abnormally elevated temperatures such that supplemental air flow from an adjacent cooling canister is required to cool the set of servers.

FIG. 5B illustrates dampers 504 and 506 opening in response to a failure of fan 510. Air flows between cooling canister 502 and 500 to supplement air flow through cooling canister 502 in response to the failure of fan 510. In some embodiments, a cooling canister, such as cooling canister 502, may be coupled with a set of more than one fan 510. In such an arrangement one of the set of fans 510 may fail while the remaining fans 510 of the set remain in operation. In such arrangements a portion of dampers 504 and 506 may open while other ones of the dampers remain closed. In some embodiments, dampers may be installed in each of two coupled openings as shown in FIGS. 5A and 5B. In some embodiments, a single set of dampers, such as dampers 504 or 506 may be coupled in one or the other of two coupled openings.

In some embodiments, dampers such as dampers 504 and 506 may be operated by a spring mechanism or controlled by an actuator.

Figure 6A:
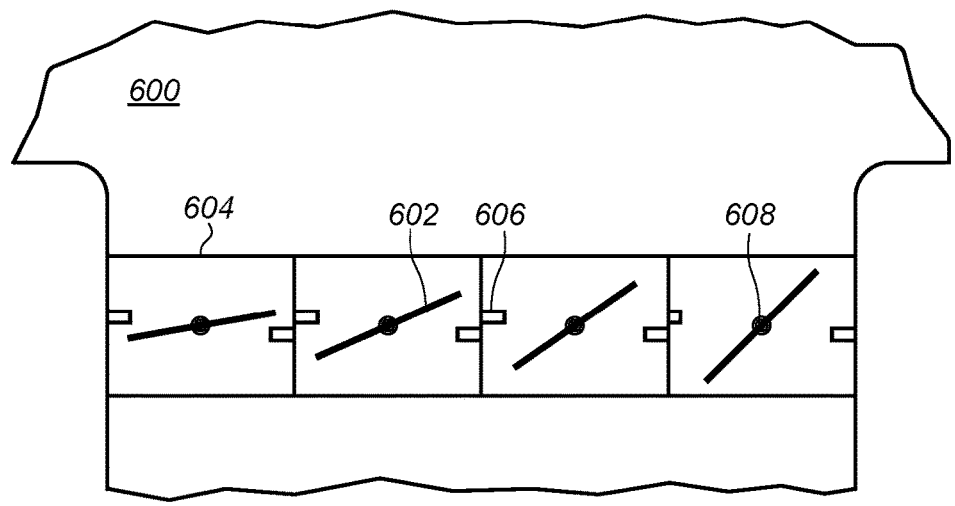
FIG. 6A illustrates a cutaway of dampers in an opening of a canister body of a cooling canister that include spring mechanisms, according to some embodiments.

FIG. 6A illustrates a cutaway of dampers in an opening of a canister body of a cooling canister that include spring mechanisms, according to some embodiments. Opening 600 includes dampers 604. Dampers 604 include flappers 602, stops 606, and spring mechanisms 608. A spring mechanism in a damper, such as spring mechanisms 608, may bias a damper to be closed under normal operating conditions. The spring mechanism may exert a torsional force on the flapper that causes the flapper to engage with stops 606. In some embodiments, stops 606 may include a sealing surface such as a gasket material that at least partially seals the flapper against the stop so that a minimal amount of air flows through the damper when the damper is closed. When abnormal operating conditions cause a pressure differential on either side of the flapper, the pressure differential may overcome the torsional force exerted on the flapper by the spring mechanism and cause the flapper to open. For example, in the case of a fan failure, a pressure in a cooling canister coupled with the failed fan may rise in comparison to a pressure in an adjacent cooling canister without a failed fan. The pressure differential between the adjacent cooling canisters may cause dampers located in coupled openings between the adjacent cooling canisters to open. As a result of the dampers opening, a supplemental air flow may be permitted between the adjacent cooling canisters to supplement a cooling air flow deficit that resulted from the failed fan. In some embodiments, a spring mechanism in a damper, such as spring mechanisms 608, may be selected to open when a differential pressure between adjacent cooling canisters exceeds a threshold pressure differential. Therefore, adjacent cooling canisters that are coupled together via openings that form a super plenum may support air flow isolation between the adjacent cooling canisters as long as the resulting pressure differentials are below the threshold pressure differential that causes the dampers to open, but also provide redundancy for the sets of fans coupled with the cooling canisters. The redundancy may be provided by sets of fans coupled with adjacent cooling canisters supplementing air flow through a particular cooling canister in the event of a fan failure in a set of fans coupled with the particular cooling canister.

In some embodiments, a cooling controller may control electrical actuators that adjust the positions of flappers in a set of dampers.

Figure 6B:
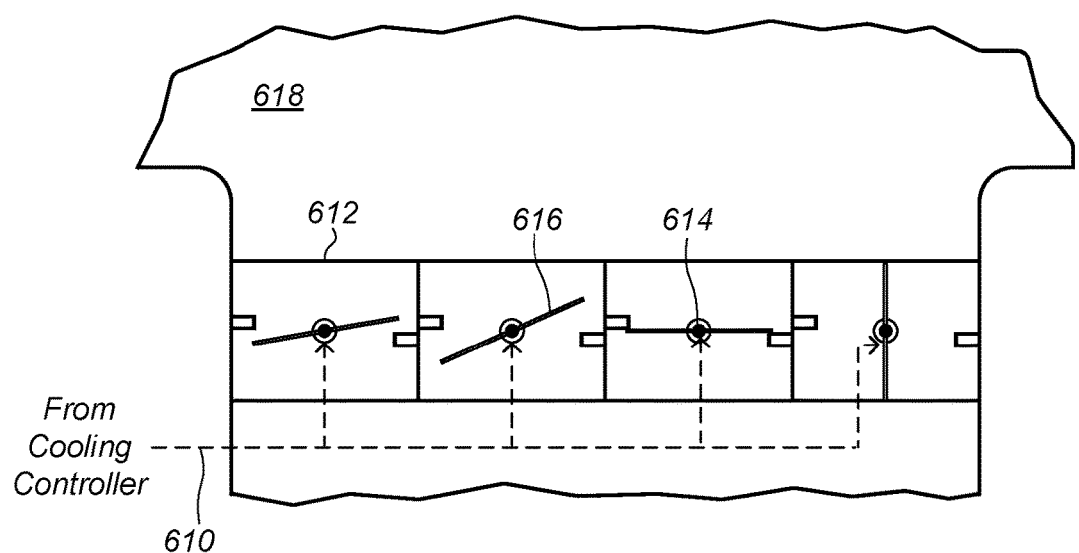
FIG. 6B illustrates a cutaway of dampers in an opening of a canister body of a cooling canister that include actuators, according to some embodiments.

FIG. 6B illustrates a cutaway of dampers in an opening 618 of a canister body of a cooling canister that include actuators, according to some embodiments. Dampers 612 may include flappers and stops similar to the flappers and stops described in regard to dampers 604 in FIG. 6A. Dampers 612 may include actuators 614 that receive control signals 610 from a cooling controller, such as cooling controllers 134, 136, and 138 described in FIG. 1B. A cooling controller may generate control signals that cause actuators 614 to adjust flappers 616 to regulate an air flow between adjacent cooling canisters via coupled openings in canister bodies of the adjacent cooling canisters. In some embodiments, a cooling controller may generate control signals 610 to supplement air flow between adjacent cooling canisters due a fan failure or control anomaly.

In some embodiments a shape memory allow that changes shape based on a surrounding temperature passing a certain temperature value may be used as a actuator in a damper. For example, a nitinol actuator may be used that causes a damper to open when a temperature exceeds a certain value and to close when the temperature is below the certain value.

Any of the cooling canisters described in FIGS. 1-14 may include dampers such as the dampers described in FIGS. 5A-5B and FIGS. 6A-6B. In some embodiments, a cooling canister, such as any of the cooling canisters described in FIGS. 1-14 may include an opening configured to couple with an opening in an adjacent cooling canister that does not include a damper.

Figure 7A:
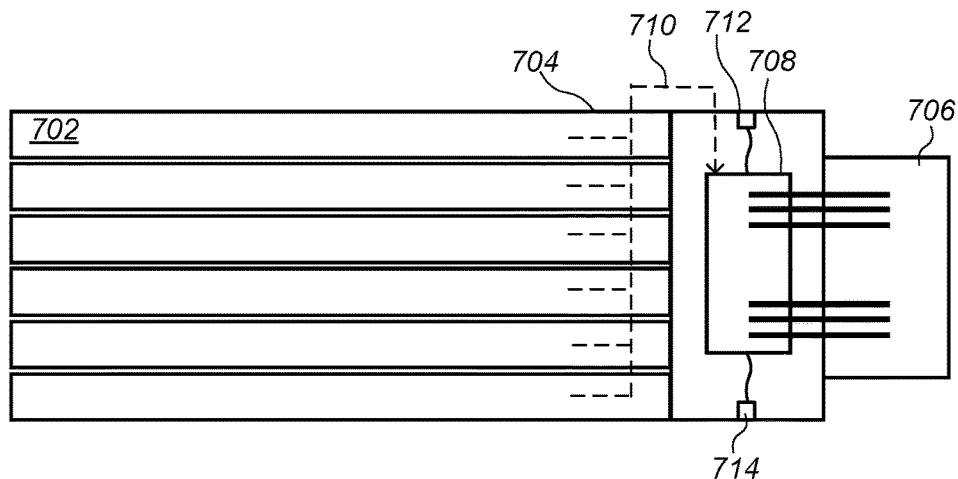
FIG. 7A illustrates a cooling controller and a cooling canister, according to some embodiments.
Figure 7B:
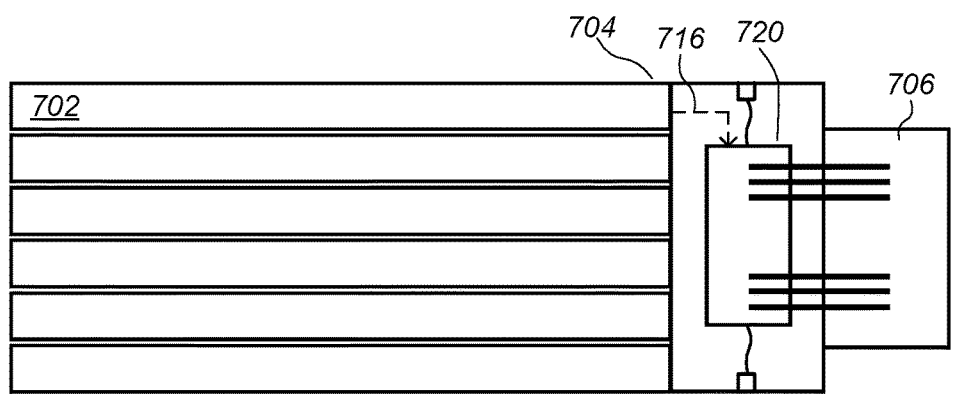
FIG. 7B illustrates a cooling controller and a cooling canister, according to some embodiments.
Figure 7C:
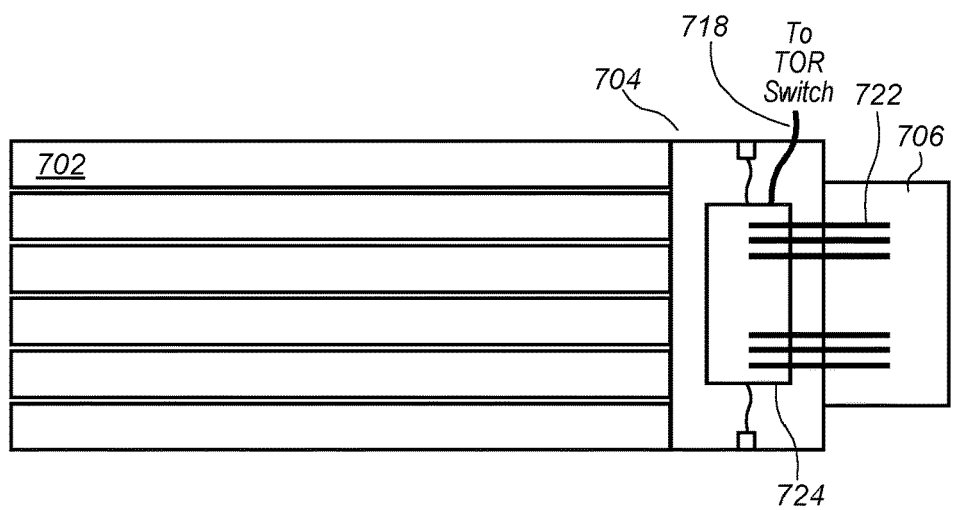
FIG. 7C illustrates a cooling controller and a cooling canister, according to some embodiments.

FIGS. 7A-C illustrate a cooling controller in a system that includes a cooling canister, according to some embodiments. Cooling controllers 134, 136, and 138 illustrated in FIG. 1B may be any of the cooling controllers described in FIGS. 7A-7C. In some embodiments, a cooling controller, such as cooling controller 708 illustrated in FIG. 7A, may include a control board that receives condition signals indicating thermal conditions in servers 702. For example, sensors in servers 702 may generate condition signals 710 that are received by cooling controller 708. In some embodiments, servers 702 may include virtual sensors that generate condition signals indicating a thermal condition based on measurements of some other condition. For example, a virtual sensor may generate a condition signal indicating a temperature based on a measured processor workload or measured power consumption. A cooling controller, such as cooling controller 708, may determine an output signal to control one or more fans included in an set of fans coupled with a cooling canister that corresponds with the cooling controller based at least in part on received condition signals from multiple sensors or virtual sensors in the individual servers associated with the cooling canister, such as condition signals 710 from servers 702.

In some embodiments, a cooling controller, such as controller 708, may receive multiple measurements relating to conditions in servers 702 and determine an output for controlling fans based on the received measurements. In some embodiments the received measurements, may include processor temperature, air temperature, air pressure, power consumption, or other measurements indicative of an amount of waste heat needing to be removed from servers, such as servers 702.

In some embodiments, a cooling controller, such as cooling controller 708, may receive additional condition signals from one or more adjacent cooling canisters. For example, cooling controller 708 may receive additional condition signals via connectors 712 and 714 that are coupled to connectors of adjacent cooling canisters. In some embodiments, condition signals from an adjacent cooling canister may indicate thermal conditions in a set of servers coupled with the adjacent cooling canister. In some embodiments, condition signals from an adjacent cooling canister may indicate control parameters of the adjacent cooling canister. For example, condition signals from an adjacent cooling canister may include fans speeds or damper flapper positions of an adjacent cooling canister. A cooling controller, such as cooling controller 708, may use received condition signals from an adjacent cooling canister to coordinate control of the set of fans and/or dampers coupled with the cooling canister that includes the cooling controller with a set of fans and/or dampers coupled with the adjacent cooling canister. In some embodiments, a cooling controller of a particular cooling canister may control sets of fans coupled with adjacent cooling canisters via connectors 712 and 714 coupled with corresponding connectors of the adjacent cooling canisters.

In some embodiments, control logic that implements a cooling controller may be implemented in software executed by one or more of servers 702. For example, FIG. 7B illustrates server 702 determining an output signal for controlling air moving device 706 and sending output signal 716 to controller 720. Controller 720 may in turn control air moving device 706 in accordance with the control signal for air moving device 706 received from the one or more of servers 702 that implements the control logic for the cooling controller.

In some embodiments, control decisions for controlling an air moving device may be made by a central controller that controls multiple air moving devices. For example, FIG. 7C illustrates a control signal being received from a top of rack switch via connection 718. A controller, such as controller 724, may be mounted in a cooling canister such as cooling canister 704, or may be mounted in an air moving device such as air moving device 706. Any of the controllers 708 described in regards to FIGS. 7A and 7B may be mounted in a cooling canister, such as cooling canister 704. A controller that receives a control signal from a central controller, may control one or more fans in an air moving device in accordance with the received control signal. For example, controller 724 may send control signals 722 to fans mounted in air moving device 706 in accordance with a control signal received via connection 718 to a top of rack switch. In some embodiments, a central controller may communicate with one or more servers 702 and the one or more servers 702 may communicate control signals to a controller 724 without a connection 718 to a top of rack switch.

Figure 8:
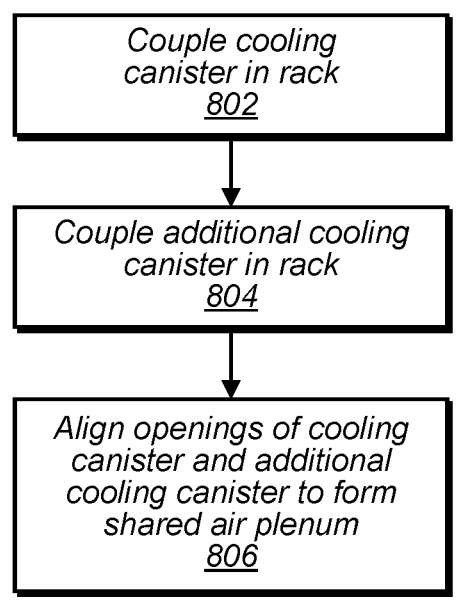
FIG. 8 illustrates a method of installing cooling canisters in a rack, according to some embodiments.

FIG. 8 illustrates a method of installing cooling canisters in a rack, according to some embodiments. At 802 a cooling canister is coupled in a rack. In some embodiments, the cooling canister may include a server containment section that holds multiple servers. Servers may be installed in a server containment section of a cooling canister prior to or subsequent to a cooling canister being installed in a rack. In some embodiments, a cooling canister may not include a server containment section and may couple with a subset of servers already installed in a rack. The cooling canister may be mounted in a space adjacent to a respective subset of servers and may be mounted upstream of an airflow through the respective subset of servers or mounted downstream of an airflow through the respective subset of servers.

At 804, an additional cooling canister may be coupled in a rack position adjacent to the cooling canister coupled in the rack at 802.

At 806, openings in the adjacent cooling canisters coupled to the rack at 802 and 804 are aligned. In some embodiments cooling canisters may be loosely coupled to a rack, then have the corresponding openings in the cooling canisters aligned and subsequently be more securely coupled in the rack. In some embodiments, openings in canister bodies of adjacent cooling canisters may be aligned while the cooling canisters are being coupled in the rack, such as at 802 and 804. The coupled openings may form a super plenum between the adjacent cooling canisters and may include one or more sets of dampers in the openings. Any of the cooling canisters described in regard to FIGS. 1-7 may be installed in a rack as described in regard to FIG. 8.

Coordinated Cooling Control

Sets of fans coupled with adjacent cooling canisters may be controlled in coordination to manipulate an amount of air that flows between the adjacent cooling canisters via coupled openings in the canister bodies of the adjacent cooling canisters.

From time to time a fan of a set of fans coupled to a cooling canister may fail or otherwise not be in operation. In such circumstances it may be beneficial and/or necessary to coordinate control of sets of fans in adjacent cooling canisters to provide adequate air flow to sets of servers coupled with one or more of the adjacent cooling canisters. For example, a first cooling canister may include six servers and be coupled with two large (e.g. 200 millimeter or greater) fans. A second cooling canister may also include six servers and be coupled with two large fans. In the event of a failure of one of the fans coupled with the first cooling canister, the remaining large fan may have insufficient capacity to adequately cool the six servers included in the first cooling canister. However, three large fans (i.e. the two large fans coupled with the second cooling canister and the remaining large fan coupled with the first cooling canister) may have sufficient capacity to cool 12 servers (i.e. the six servers included in the first cooling canister and the six servers included in the second cooling canister). In order for the three remaining fans to cool the servers included in the first cooling canister and the servers included in the second cooling canister, the remaining three fans may be controlled in coordination with each other. For example, both of the fans coupled with the second cooling canister may operate at speeds greater than what is necessary to cool the six servers included in the second cooling canister. Excess air generated by the fans coupled with the second cooling canister operating at above required speeds may provide a supplemental flow of air through the coupled openings and through the first cooling canister. In some embodiments, coordinating control of sets of fans coupled with adjacent cooling canisters may include coordinating one or more dampers mounted in respective openings of the adjacent cooling canisters.

In another example, sets of fans coupled with adjacent cooling canisters may be controlled in coordination in response to other control events, such as one or more control anomalies. A control anomaly may include a current set of conditions that causes a cooling controller's performance related to cooling sets of servers coupled with cooling canisters to deviate from one or more expected cooling performances. For example, a failed fan, as described above, may cause a control anomaly.

As another example, a control anomaly may also be caused by a non-uniformly distributed heat load. For example, a particular server or group of servers in a set of servers coupled with a particular cooling canister may generate considerably more waste heat than other sets of servers coupled with other cooling canisters in a rack. Without coordinated control, a cooling controller controlling a set of fans coupled with the particular cooling canister may generate control signals that cause the set of fans to direct a greater volume of air through the particular cooling canister. As a consequence of directing a greater volume of air through the particular cooling canister, a pressure differential between the particular cooling canister and adjacent cooling canisters may increase. The increased pressure differential may result in a portion of the greater volume of air generated by the set of fans coupled with the particular cooling canister passing into the adjacent cooling canisters instead of flowing through the set of servers coupled with the particular cooling canister. As a result of the portion of the air flow from the particular cooling canister passing through the adjacent cooling canisters, respective cooling controllers controlling sets of fans coupled with the adjacent cooling canisters may direct less air through the adjacent cooling canisters. Consequently the pressure differential between the particular cooling canister and the adjacent cooling canisters may further increase resulting in even more air flow passing from the particular cooling canister into the adjacent cooling canisters. However, respective coordinated cooling controllers may detect a control anomaly such as this and cause the respective cooling controls to determine coordinated control outputs for controlling the respective sets of fans. For example, respective cooling controllers of adjacent cooling canisters may detect a deviation in a measured amount of waste energy being removed per unit of airflow (e.g. watts removed per cubic centimeter per second of air flow) compared to an expected amount of waste energy to be removed per unit of airflow. In response to detecting the deviation exceeds a threshold (i.e. detecting a control anomaly), the respective cooling controller may operate in a coordination with a cooling controller of an adjacent cooling canister to coordinate fans speeds amongst sets of fans controlled by the cooling controllers.

In some embodiments, in order to coordinate control between cooling controllers of adjacent cooling canisters, the cooling controller may communicate condition information between the cooling controllers of adjacent cooling canister via coupled connectors, as described above in regard to FIG. 1B. For example, a cooling controller may receive thermal condition signals indicating thermal conditions in servers coupled with an adjacent cooling canister. A cooling control may also receive control outputs being used to control sets of fans and/or dampers coupled with an adjacent cooling canister. For example, a cooling controller may communicate with an adjacent cooing controller that the cooling controller is controlling a set of fans controlled by the cooling controller at 80% and 90% output and is controlling a damper coupled in an opening of a cooling canister associated with the cooling controller at 40% open. The adjacent cooling controller may use the communicated thermal conditions and/or control outputs to in determining control outputs for a set of fans controlled by the adjacent cooling controller and for determining a set of outputs for controlling a set of dampers associated with the adjacent cooling controller.

In some embodiments, model based control may be used by cooling controllers in adjacent cooling canisters to coordinate control outputs. For example, a model may include relationships between detected thermal conditions and control outputs. A cooling controller may access a model and apply information relating to current thermal conditions in servers being cooled by the cooling controller to the model to determine control outputs for controlling a set of fans coupled with a cooling canister associated with the cooling controller. In some embodiments, models used in model based control may be generated using machine learning techniques. In some embodiments, a cooling controller that includes model based control may include several different models for different operational states. For example, a cooling controller that includes model based control may have a first model for controlling a set of fans when all the fans of the set of fans are in operation and a second model for controlling the set of fans when one or more of the set of fans is not in operation. For example, two adjacent cooling canisters may each include six servers and respective sets of two fans coupled with the adjacent cooling canisters. Respective cooling controllers in the respective cooling canisters may control using a first model when all four fans of the two sets of fans are in operation. In the event of a failure of one of the four fans, the remaining three fans may be controlled by one of the respective cooling controllers using a second model that models control of three fans cooling 12 servers in two cooling canisters. In some embodiments, a cooling controller may include multiple models for controlling in multiple operational states.

Figure 9:
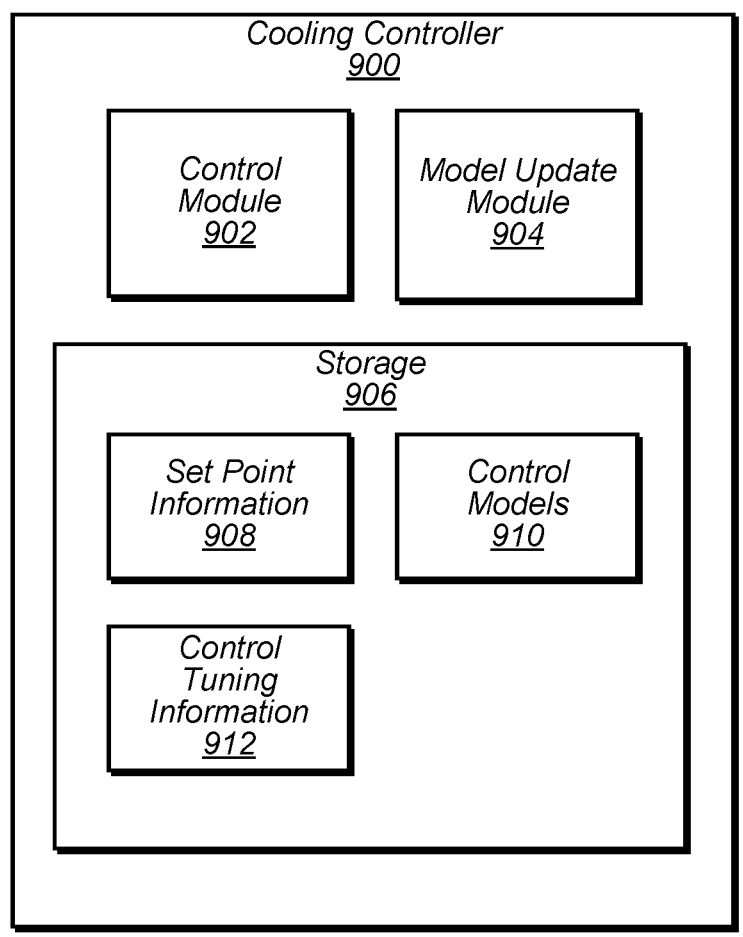
FIG. 9 illustrates a cooling controller, according to some embodiments.

FIG. 9 illustrates a cooling controller, according to some embodiments. A cooling controller may include a control module, a storage, and a model update module. A storage of a cooling controller may store set point information, control tuning information, and control models. For example cooling controller 900 includes control module 902, model update module 904, and storage 906 that includes set point information 908, control models 910 and control tuning information 912. In some embodiments a cooling control module may access information stored in a storage such as storage 906 to determine a control value for a control signal to be generated by a cooling controller, such as cooling controller 900. For example, control module 902 may access set point information 908, control tuning information 912 and control models 910. Set point information 908 may include information regarding set points for cooling a plurality of electronic devices mounted in a rack. For example set point information 908 may include temperatures that are not to be exceeded in electronic devices, such as servers, mounted in a rack. In some embodiments, separate servers mounted in separate positions in a rack may be controlled to different set points.

Control tuning information 912 may include information such as proportional gain constants, derivate gain constants, and error gain constants. Control tuning information may also include information that instructs how a control module responds to changes in thermal conditions in servers mounted in a rack. For example, control tuning information may instruct a control module on how fast or slow to change fan speeds in response to a change in thermal conditions in one or more servers mounted in a rack. In another example, control tuning information may instruct a control module on how fast or slow to change a damper position in response to a change in thermal conditions in one or more servers mounted in a rack. In some embodiments, set point information 908 and control tuning information 912 may be included in a control model, such as one of control models 910. In some embodiments, a model update module, such as model update module 904 may be configured to perform an initialization operation to generate control models or a portion thereof, or to perform an update operation to update control models.

In some embodiments, a cooling controller such as cooling controller 900 may be implemented in software that operates on a server in a rack. In some embodiments, a cooling controller, such as cooling controller 900, may be implemented in hardware, such as a PLC. In some embodiments, a control module, such as control module 902, may be implemented on a PLC, and may access a storage, such as storage 906 on a server, wherein the storage includes set point information, control tuning information and/or models, such as set point information 908, control tuning information 912, and/or control models 910.

In some embodiments, control models stored in a storage of a cooling controller, such as control models 910 stored in storage 906, may be generated using machine learning techniques.

In some embodiments, a control module, such as control module 902, may access a storage, such as storage 906 and select a control model of a plurality of control models stored in the storage, such as one of control models 910 stored in storage 906, based on one of the control models more closely corresponding to a current operational state of a set of fans controlled by the cooling controller.

Figure 10:
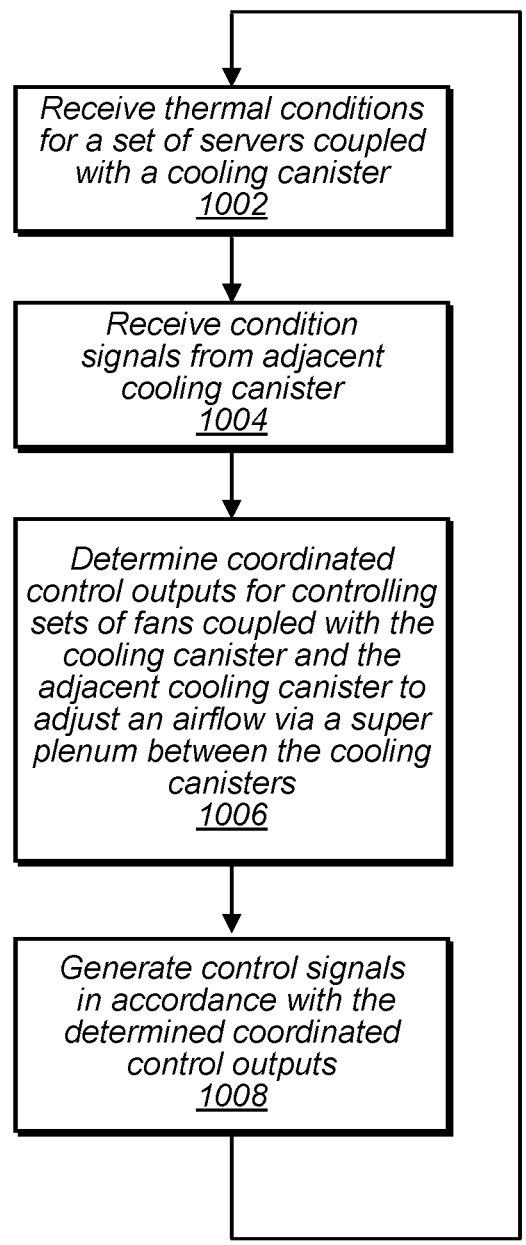
FIG. 10 illustrates a method of coordinating cooling in adjacent cooling canisters, according to some embodiments.

FIG. 10 illustrates a method of coordinating cooling in adjacent cooling canisters, according to some embodiments. The method of coordinating cooling in adjacent cooling canisters as illustrated in FIG. 10 may be performed by a cooling controller, such as cooling controller 900 described in regard to FIG. 9.

At 1002 a cooling controller receives thermal conditions for a set of servers coupled with the cooling canister. The thermal conditions may include one or more of temperature, air flow, humidity, processor load, power consumption, etc. In some embodiments, thermal conditions may be received from virtual sensors that generate thermal conditions to be sent to the cooling controller based on one or more other measured variables. For example, a virtual temperature sensor may generate a condition signal indicating a temperature associated with a server based on a measured power consumption of the server.

At 1004, the cooling controller receives condition signals from an adjacent cooling canister. The condition signals may be received by the cooling controller via a wired connector that is coupled to the cooling controller on one end and coupled with a wired connector of an adjacent cooling canister that is also coupled to a cooling controller of the adjacent cooling canister. In some embodiments, the condition signals received from the adjacent cooling canister may include thermal conditions such as described at 1002. In some embodiments, the condition signals received from an adjacent cooling canister may include control parameters being used to control a set of fans and/or dampers coupled with the adjacent cooling canister. In some embodiments, the condition signals may indicate that an adjacent cooling canister is experiencing a control anomaly, such as a failed fan.

At 1006, the cooling controller determines coordinated control outputs for controlling a set of fans coupled with the cooling canister, wherein the control outputs for controlling the set of fans are coordinated with another set of fans coupled with an adjacent cooling canister. For example, a cooling controller may use the condition signals received from the adjacent cooling canister as a feedback term in a controller that determines control outputs for the set of fans controlled by the cooling canister. In some embodiments, in response to a control anomaly, a cooling controller may override a cooling controller of an adjacent cooling canister and control a set of fans coupled with the adjacent cooling canister. The same cooling controller may also control the set of fans coupled with the cooling canister that includes the cooling controller. Thus the cooling controller may function as a single cooling controller for the set of fans controlled by the cooling controller and set of fans coupled with the adjacent cooling canister. In some embodiments, a cooling controller may use a model to determine coordinated control outputs for controlling a set of fans. In some embodiments the model may be a model for a single cooling canister and set of fans coupled with the cooling canister. In some embodiments, a model may be a common model for multiple cooling canisters, such as adjacent cooling canisters.

At 1008, the cooling controller generates control signals for controlling a set or sets of fans controlled by the cooling controller in accordance with the determined coordinated control outputs. The cooling controller then reverts back to 1002 and receives additional thermal conditions for the set of servers coupled with the cooling canister that includes the cooling controller.

Figure 11:
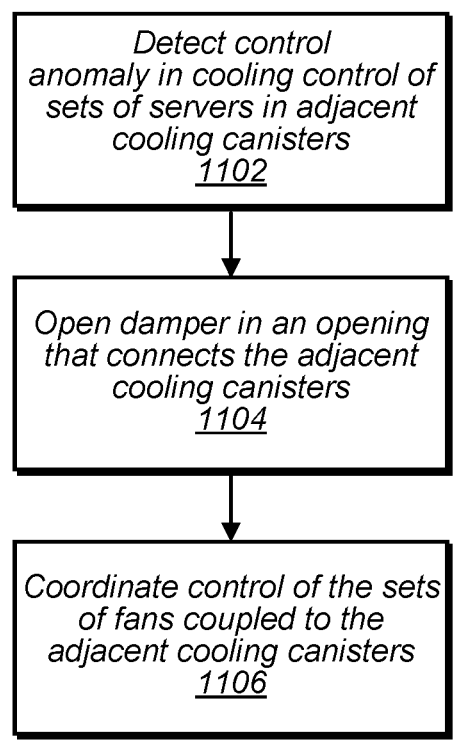
FIG. 11 illustrates a method of coordinating cooling in adjacent cooling canisters, according to some embodiments.

FIG. 11 illustrates a method of coordinating cooling in adjacent cooling canisters during a control anomaly event, according to some embodiments. As discussed above, a control anomaly may include a current set of conditions that causes a cooling controller's performance related to cooling sets of servers coupled with cooling canisters associated with the cooling controller to deviate from one or more expected cooling performances. For example, a failed fan or a non-uniform waste heat distribution across servers may cause a control analogy. At 1102, a control anomaly is detected in the cooling performance of one or more cooling controllers of adjacent cooling canisters. For example, the control anomaly may be a failed fan and may be detected based on a drop in fan power consumption. In another example, a control anomaly may be a deviation between current performance at removing waste heat per unit of airflow and an expected amount of waste heat to be removed per unit of airflow. For example, a cooling controller may calculate a current airflow based on a fan speed and may calculate an amount of waste heat to be removed based on server power consumption. If more air flow than is expected is required to maintain a server temperature for a given level of power consumption, this may indicate a deviation in cooling performance and be detected as a control anomaly by a cooling controller.

At 1104, in response to detecting the control anomaly, one or more dampers in coupled openings between adjacent cooling canisters are at least partially opened to allow air to flow between the adjacent cooling canisters that form a super plenum that connects the canister bodies of the adjacent cooling canisters. A supplemental airflow from one of the adjacent cooling canisters may supplement an air flow deficit in the other adjacent cooling canister such that an adequate amount of air flows through the adjacent cooling canister to cool a set of servers coupled with the adjacent cooling canister. In some embodiments, adjacent cooling canisters may be coupled together via openings in canister bodies of the adjacent cooling canisters without having dampers located in the openings of the canister bodies of the adjacent cooling canisters. In such embodiments 1104 may be omitted.

At 1106, a cooling controller controls a set of fans coupled with a cooling canister that includes the cooling controller and coordinates the control with a cooling controller that controls a set of fans coupled with the adjacent cooling canister. In some embodiments, the cooling controller may override a cooling controller in the adjacent cooling canister, such that the cooling controller controls the set of fans coupled with the cooling canister and a set of fans coupled with an adjacent cooling canister as a single set of fans controlled by a common cooling controller, i.e. the cooling controller included in the cooling canister.

In some embodiments, a cooling controller controlling multiple sets of fans may control via a feedback control loop that includes thermal conditions in servers in cooling canisters coupled with the multiple sets of fans. In some embodiments, cooling controllers in adjacent cooling canisters may independently control sets of fans coupled with the adjacent cooling canisters, but may coordinate control by sharing thermal conditions and control outputs with each other. The cooling controllers in the adjacent cooling canisters may use received thermal conditions or control outputs that relate to an adjacent cooling canister as an input to calculating control outputs for the set of fans controlled by the cooling controller. In some embodiments, a cooling controller may be a model based cooling controller that includes one or more models that include relationships between observed thermal conditions and control outputs for removing waste heat from servers experiencing similar thermal conditions. In some embodiments, models used by a cooling controller may be generated using machine learning techniques.

Figure 12:
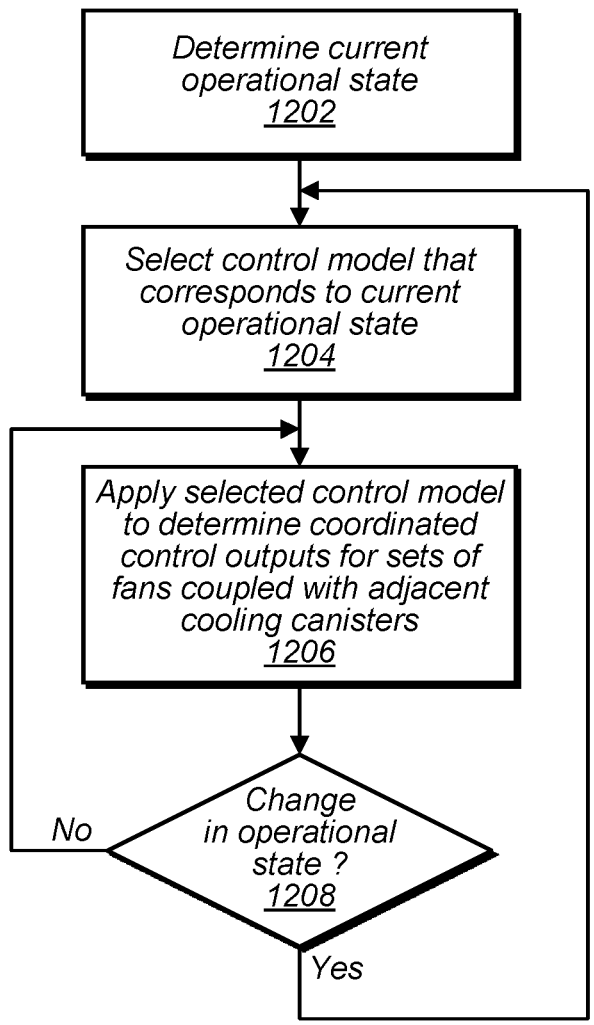
FIG. 12 illustrates a method of coordinating cooling in adjacent cooling canisters using control models, according to some embodiments

FIG. 12 illustrates a method of coordinating cooling in adjacent cooling canisters using control models, according to some embodiments. At 1202 a current operational state for fans and servers coupled with adjacent cooling canisters is determined. For example, an operational state may be that all of the fans coupled with the adjacent cooling canisters are in operation. An operational state may be that a particular one or more fans coupled with particular ones of the adjacent cooling canisters are not in operation or have reduced capacities.

At 1204, a control model is selected from a set of control models that correspond to different operational states for fans and servers coupled with adjacent cooling canisters. For example one fan in a set of fans coupled with a cooling canister may not be in operation and a control model that corresponds to a failed fan in that location is selected.

At 1206, the selected control model is accessed to determine coordinated control outputs for one or more sets of fans that are being controlled by the cooling controller. For example, a certain profile of server temperatures or amounts of waste heat to be removed may be determined based on condition signals received by the cooling controller that indicate thermal conditions in a set of servers coupled with a cooling canister that includes the cooling controller. The cooling controller may access the model to locate a similar profile of server temperatures stored in the model and retrieve a corresponding set of control outputs that are known to efficiently cool servers experiencing the similar server temperature profile. The cooling controller may continuously or nearly continuously access the model to control the one or more sets of fans based on changing conditions indicated by condition signals.

At 1208 it is determined if there is a change in operational state of the one or more sets of fans, dampers, or sets of servers. For example, an additional fan may cease to be operational, or a previously non-operational fan may have been placed back in operation. If there is not a change in operational state the cooling controller reverts back to 1206 and continues to control based on the selected control model. If there is a change in operation state, the cooling controller reverts to 1204 and selects a control model that corresponds to the changed operational state.

Figure 13:
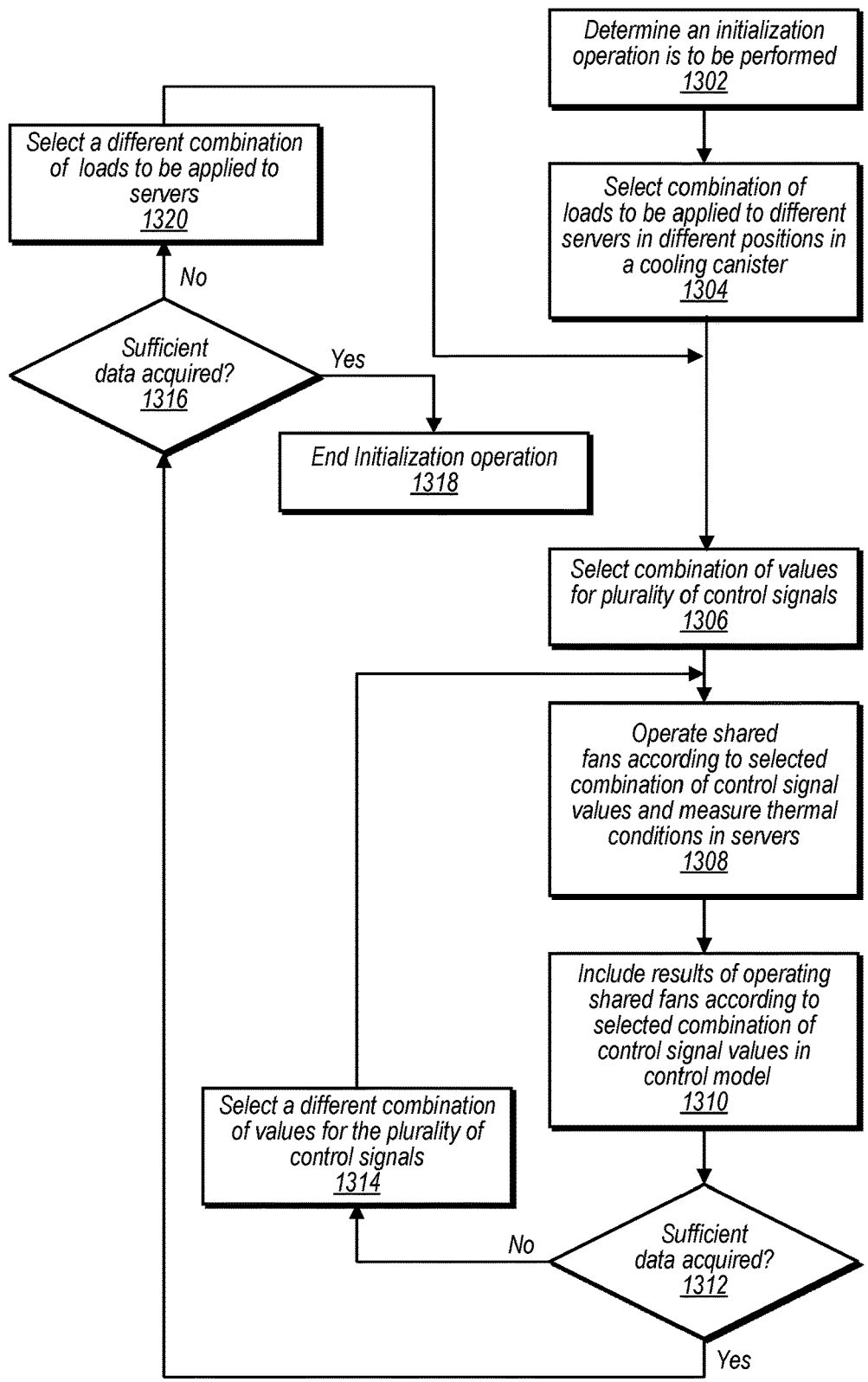
FIG. 13 illustrates performing an initialization operation to generate control models for a cooling controller, according to some embodiments.

FIG. 13 illustrates initializing a model based cooling controller, according to some embodiments. At 1302 it is determined that an initialization operation is to be performed to generate a set of models to be used in the model based cooling controller. A determination to perform an initialization operation may be based on a received command or may be automatically initiated by a cooling controller based on a condition being met. For example, when a rack is first put in service, a command may be sent to a cooling controller instructing a model update module to perform an initialization operation. In another example, a cooling controller may determine that configurations in a cooling canister or set of fans coupled with a cooling canister have changed since the last time an initialization operation was performed and automatically determine that an initialization operation is to be performed.

At 1304 a combination of loads to be applied to the servers mounted in the cooling canister is selected. For example, a combination of loads may be to operate different servers in different positions in the cooling canister under high loads while other ones of the servers in other positions in the cooling canister are operated at medium loads or low loads.

At 1306 a combination of control signal values are selected for controlling a plurality of shared fans coupled with the cooling canister. The plurality of shared fans may comprise two or more shared fans, wherein each shared fan is associated with a different respective location in an array. The combination of control signal values selected for controlling the shared fans coupled with the cooling canister may command shared fans in two or more different locations in the array to operate at different speeds.

At 1308, the shared fans are operated in accordance with the selected set of control signal values and the selected combination of loads to be applied to the different servers in the different positions in the cooling canister. While the shared fans are operated in accordance with the set of control signal values and the servers are operated in accordance with the combination of loads, thermal conditions in two or more of the servers may be measured. The two or more servers may be associated with different positions in the cooling canister. The measurements while the fans are in operation may indicate performance of the shared fans while operating according to the selected combination of control signal values for removing thermal energy from respective servers located in different respective positions in a cooling canister when the servers mounted in the cooling canister are operated in accordance with the selected combination of loads. In some embodiments, a model may include servers in multiple cooling canisters, such as adjacent cooling canisters, and may include multiple sets of fans, such as sets of fans coupled with adjacent cooling canisters.

At 1310, the results of operating the shared fans according to the selected combination of control signal values and operating the servers according to the selected combination of loads are used to update a cooling control model. The results may include capacities of the fans when operated in the particular selected combination of control signal values to remove thermal energy from different respective servers mounted in different respective positions in a cooling canister. The control signal values may include a fan speed and a damper position (for models that include multiple cooling canisters). In some embodiments, different relationships may be derived from the results of operating the two or more shared fans according to the selected combination of control signal values and operating the servers according to the selected combination of loads. The different derived relationships may then be included in a cooling control model.

At 1312, it is determined if a sufficient amount of data has been acquired for the selected combination of loads to be applied to the servers mounted in the cooling canister(s). In some embodiments, an initialization operation may run through a set number of combinations of control signal values, such that when the set number of combinations has been tested the cooling controller determines that sufficient data has been acquired for the selected combination of loads to be applied to the servers. In some embodiments various machine learning techniques, such as neural networks, may be used to determine when sufficient data has been acquired for a combination of loads.

In response to determining a sufficient amount of data has not been acquired at 1314, a different combination of values for the plurality of control signal values is selected and the process returns to 1308. During an initialization operation multiple different combinations of values for the control signals may be tested and resulting performance values measured and recorded for the multiple different combinations of control signal values. At 1316, it is determined if sufficient data has been acquired for the overall initialization operation or if another combination of loads to be applied to the servers in different positions in the cooling canister is to be selected. In a similar manner as determining if enough combinations of values for the plurality of control signals have been tested, a model update module may determine whether enough combinations of loads have been tested. In some embodiments, an initialization operation may test a set number of combinations of loads and when the set number have been tested, the model update module may determine that sufficient data has been acquired. In some embodiments, various machine learning techniques may be used to determine if enough data has been acquired. In response to determining sufficient data has been acquired for the overall initialization operation, at 1318 the initialization operation ends. In response to determining additional combinations of loads are to be tested, at 1320 a different combinations of loads are selected and the initialization operation reverts back to 1306.

Figure 14:
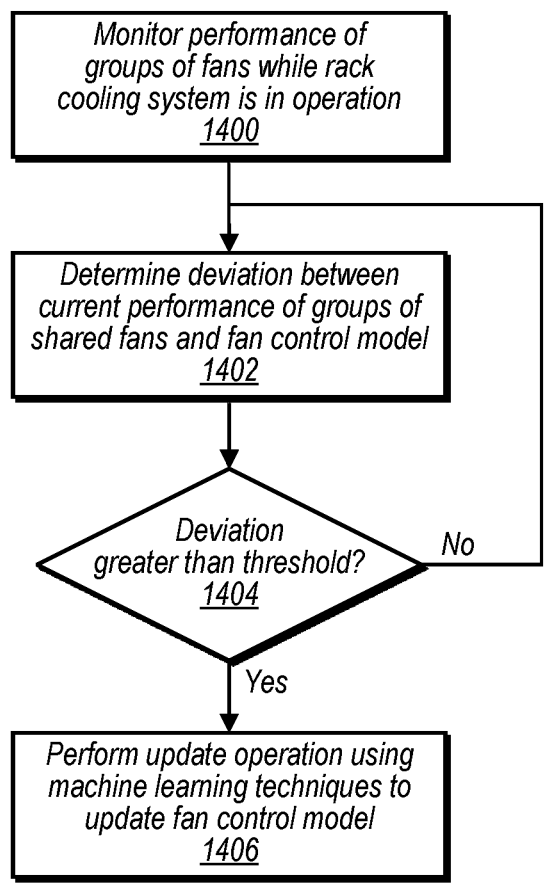
FIG. 14 illustrates updating control models used by a cooling controller, according to some embodiments.

FIG. 14 illustrates updating a cooling control model, according to some embodiments. At 1400 performance of shared fans are monitored while the one or more shared fans are in operation cooling servers mounted in a cooling canister. At 1402, one or more deviations between current performances of the shared fans when operating according to a certain combination of control signal values is determined in comparison to performance values included in a cooling control model for the shared fans when operated according to the same certain combination of control signal values. For example, the actual performance of the shared fans at removing thermal energy from servers may deviate from an expected performance of the shared fans at removing thermal energy that is predicted by a cooling control model. In some embodiments a control response may be delayed or a control variable such as a fan speed may reach a maximum, such as 100% output, without controlling a thermal condition in one of the servers to set point. The failure of the controller to control to set point may be determined a deviation between current performance and predicted performance predicted by a cooling control model and cause an update operation to be performed. In addition, the deviation may be determined to be a control anomaly. In response to detecting a control anomaly a common cooling control may control multiple sets of fans while a model for of the cooling controller experiencing the control anomaly is updated.

At 1404, if the deviation is greater than a threshold amount, then at 1406 an update operation is performed to update the cooling control model. The update operation may be performed using various machine learning techniques. If the deviation is less than the threshold, the process reverts to 1402 and the operation of the plurality of shared fans is continued to be monitored for deviations in performance in comparison to a fan control model.

Figure 15:
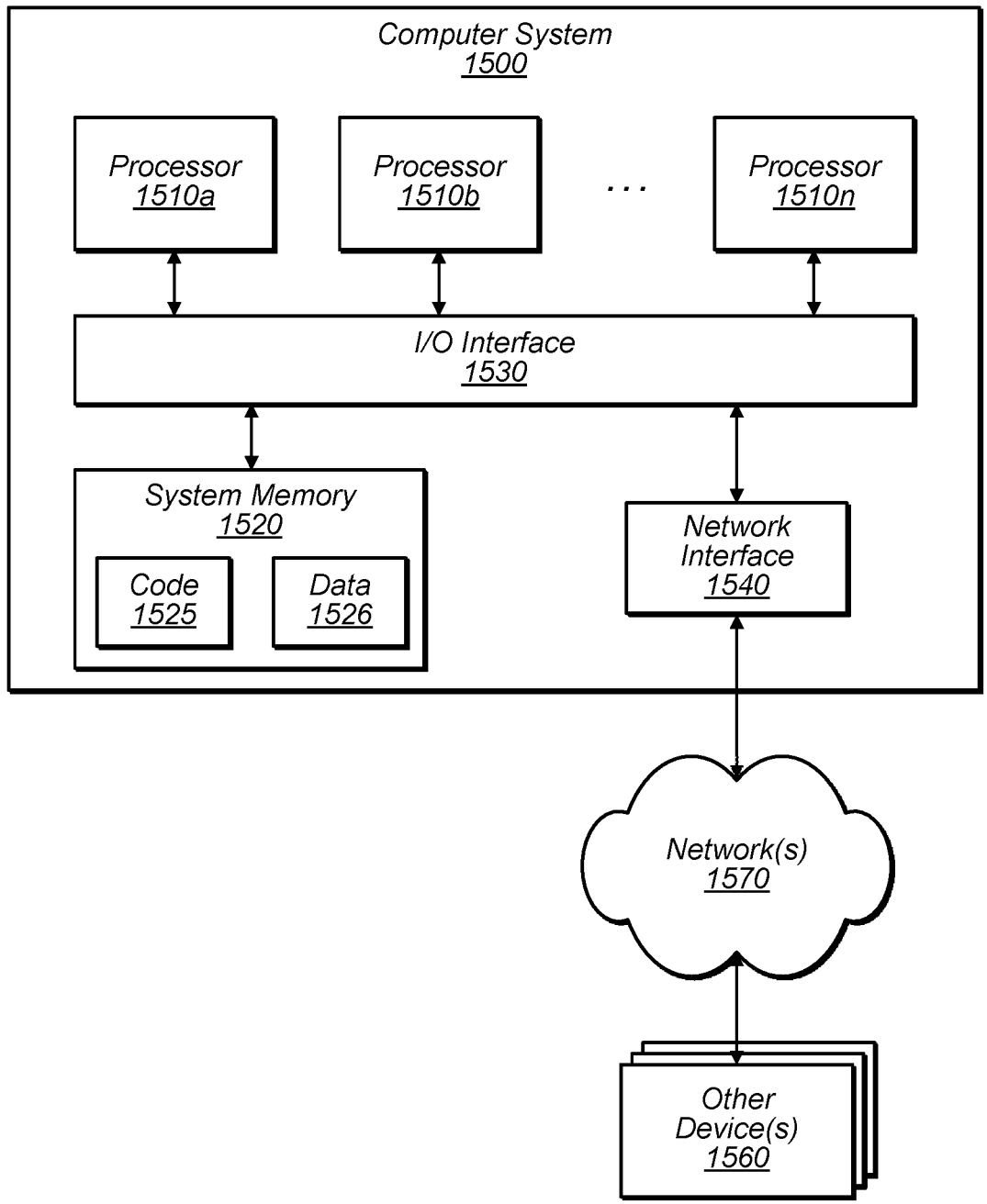
FIG. 15 illustrates a block diagram of an example computer system that may be used in some embodiments.

FIG. 15 is a block diagram illustrating an example computer system that may be used in some embodiments.

In some embodiments, a system that implements a portion or all of one or more of the technologies, including but not limited to a portion or all of the computing systems, devices, controllers, management systems, control modules, one or more modules included in the controllers described herein, may include a general-purpose computer system that includes or is configured to access one or more computer system-accessible media, such as computer system 1500 illustrated in FIG. 15. In the illustrated embodiment, computer system 1500 includes one or more processors 1510 coupled to a system memory 1520 via an input/output (I/O) interface 1530. Computer system 1500 further includes a network interface 1540 coupled to I/O interface 1530.

In various embodiments, computer system 1500 may be a uniprocessor system including one processor 1510, or a multiprocessor system including several processors 1510 (e.g., two, four, eight, or another suitable number). Processors 1510 may be any suitable processors capable of executing instructions. For example, in various embodiments, processors 1510 may be general-purpose or embedded processors implementing any of a variety of instruction set architectures (ISAs), such as the x86, PowerPC, SPARC, or MIPS ISAs, or any other suitable ISA. In multiprocessor systems, each of processors 1510 may commonly, but not necessarily, implement the same ISA.

System memory 1520 may be configured to store instructions and data accessible by processor(s) 1510. In various embodiments, system memory 1520 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as a portion or all of the controllers, one or more modules included in the controllers, and various sensors, systems, devices, and apparatuses as described herein, are shown stored within system memory 1520 as code 1525 and data 1526.

In some embodiments, I/O interface 1530 may be configured to coordinate I/O traffic between processor 1510, system memory 1520, and any peripheral devices in the device, including network interface 1540 or other peripheral interfaces. In some embodiments, I/O interface 1530 may perform any necessary protocol, timing or other data transformations to convert data signals from one component (e.g., system memory 1520) into a format suitable for use by another component (e.g., processor 1510). In some embodiments, I/O interface 1530 may include support for devices attached through various types of peripheral buses, such as a variant of the Peripheral Component Interconnect (PCI) bus standard or the Universal Serial Bus (USB) standard, for example. In some embodiments, the function of I/O interface 1530 may be split into two or more separate components, such as a north bridge and a south bridge, for example. Also, in some embodiments some or all of the functionality of I/O interface 1530, such as an interface to system memory 1520, may be incorporated directly into processor 1510.

Network interface 1540 may be configured to allow data to be exchanged between computer system 1500 and other devices 1560 attached to a network or networks 1550, such as other computer systems or devices, controllers, control modules, etc., as illustrated in FIGS. 1 through 14. In various embodiments, network interface 1540 may support communication via any suitable wired or wireless general data networks, such as types of Ethernet network, for example. Additionally, network interface 1540 may support communication via telecommunications/telephony networks such as analog voice networks or digital fiber communications networks, via storage area networks such as Fibre Channel SANs, or via any other suitable type of network and/or protocol. In some embodiments, system memory 1520 may be a computer system-accessible medium configured to store program instructions and data for implementing embodiments of controllers as described above relative to FIGS. 1-14, e.g., cooling control controller 900. In other embodiments, program instructions and/or data may be received, sent or stored upon different types of computer-accessible media. Generally speaking, a computer system-accessible medium may include non-transitory storage media or memory media such as magnetic or optical media, e.g., disk or DVD/CD coupled to computer system 1500 via I/O interface 1530. A non-transitory computer system-accessible storage medium may also include any volatile or non-volatile media such as RAM (e.g. SDRAM, DDR SDRAM, RDRAM, SRAM, etc.), ROM, etc., that may be included in some embodiments of computer system 1500 as system memory 1520 or another type of memory. Further, a computer-accessible medium may include transmission media or signals such as electrical, electromagnetic, or digital signals, conveyed via a communication medium such as a network and/or a wireless link such as may be implemented via network interface 1540.

Various embodiments may further include receiving, sending or storing instructions and/or data implemented in accordance with the foregoing description upon a computer-accessible medium. Generally speaking, a computer system-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A computing system, comprising:
   a server rack;
   servers mounted in the rack;
   a plurality of cooling canisters mounted inside the rack, wherein individual ones of the cooling canisters comprise:
      a canister body mounted inside the rack and distinct from other canister bodies mounted inside the rack, the canister body configured to couple with a corresponding set of the servers, the corresponding set of the servers comprising a plurality of the servers, the plurality of servers mounted inside the cooling canister, the canister body at least partially enclosing:
         opposing lateral sides of two or more servers of the set of the servers, a top surface of one of the set of the servers, and a bottom surface of another one of the set of the servers, such that air flowing through the set of the servers flows through the canister body; and
      an opening in the canister body configured to couple with a corresponding opening in a canister body of an adjacent cooling canister mounted inside the rack; and
   a group of fans, wherein respective ones of the plurality of cooling canisters are configured to couple with respective sets of one or more fans of the group of fans, wherein, for one of the sets of fans coupled to a corresponding cooling canister, in the case of a fan of the set of fans not being in operation, the opening in the canister body of the corresponding cooling canister is configured to permit a supplemental flow of air between the corresponding cooling canister and a corresponding adjacent cooling canister in the rack to cool the subset of servers coupled to the corresponding cooling canister.

2. The computing system of claim 1, wherein the respective sets of fans comprise fans that have a diameter that spans multiple rack slots in the rack.

3. The computing system of claim 1, wherein the individual ones of the cooling canisters further comprise:
   a control board configured to control one of the respective set of fans coupled with the individual cooling canister; and
   a connector configured to couple with an adjacent cooling canister, such that the control board of the individual cooling canister can communicate with a control board of the adjacent cooling canister.

4. The computing system of claim 1, further comprising a damper coupled in a passageway formed by one of the openings, wherein the damper is configured to regulate airflow between the adjacent cooling canisters.

5. A cooling canister, comprising:
   a canister body configured to couple with a subset of servers in a rack, the subset of servers comprising a plurality of servers mounted inside the cooling canister, the canister body further configured to at least partially enclose opposing lateral sides of two or more servers of the subset of servers, a top surface of one of the subset of servers, and a bottom surface of another one of the subset of servers, such that air flowing through the subset of servers flows through the canister body; and
   an opening in the canister body configured to couple with a corresponding opening in a canister body of an adjacent cooling canister,
   wherein the opening in the canister body of the cooling canister is configured to permit a flow of air between the cooling canister and the adjacent cooling canister.

6. The cooling canister of claim 5, wherein the canister body is configured to couple with a set of fans,
   wherein when a fan of the set of fans is not in operation, the remaining fans are not configured to provide an adequate quantity of air to cool the subset of servers;
   wherein the opening in the canister body is configured to permit a supplemental flow of air between the cooling canister and an adjacent cooling canister, such that an adequate quantity of air to cool the subset of servers is provided.

7. The cooling canister of claim 6, wherein the fans comprise at least one fan that has a diameter that spans multiple rack slots of the rack when installed in the rack.

8. The cooling canister of claim 6, wherein the cooling canister further comprises:

a control board configured to independently control the set of one or more fans.

9. The cooling canister of claim 8, wherein the cooling canister further comprises:
a connector configured to couple with an adjacent cooling canister, wherein the connector is coupled to the control board of the cooling canister and configured to pass information between a control board of the adjacent cooling canister and the control board of the cooling canister.

10. The cooling canister of claim 5, wherein the rack comprises a plurality of rack slots, and wherein the cooling canister has a height that spans more than one of the rack slots.

11. The cooling canister of claim 5, wherein the cooling canister is configured to accept servers on shelves or rails mounted within the cooling canister, wherein the cooling canister comprises a common air plenum downstream of the shelves or rails.

12. The cooling canister of claim 11, wherein the opening in the canister body is located in a portion of the canister body that encompasses the common air plenum.

13. The cooling canister of claim 12, wherein the opening is located along a top surface of the canister body in the portion of the canister body that encompasses the common air plenum, wherein the cooling canister further comprises:
an additional opening in the canister body configured to couple with a corresponding opening in a canister body of another adjacent cooling canister, wherein the additional opening in the canister body is configured to permit a flow of air between the cooling canister and the other adjacent cooling canister;
wherein the additional opening is located along a bottom surface of the canister body in the portion of the canister body that encompasses the common air plenum.

14. The cooling canister of claim 12, wherein the opening is located along a lateral side surface of the canister body in the portion of the canister body that encompasses the common air plenum.

15. The cooling canister of claim 5, further comprising a damper in the opening in the cooling canister.

16. The cooling canister of claim 5, wherein the cooling canister further comprises electrically commutated (EC) fans coupled to the body of the cooling canister, wherein the EC fans are configured to direct a flow of air through the cooling canister.

17. A method, comprising:
coupling a canister body of a first cooling canister in a first rack position of a rack, the canister body at least partially enclosing opposing lateral sides of two or more servers of a set of servers mounted inside the first cooling canister, a top surface of one of the set of servers, and a bottom surface of a bottom server of another one of the set of servers that are mounted inside the first cooling canister, such that air that flows through the set of servers in the first rack position flows through the canister body of the first cooling canister;
coupling a canister body of a second cooling canister in a second rack position of the rack such that air that flows through an additional set of servers mounted inside the second cooling canister in the second rack position flows through the canister body of the second cooling canister; and
aligning an opening in the canister body of the first cooling canister with an opening in the canister body of the second cooling canister, such that the aligned openings permit airflow between the first cooling canister and the second cooling canister to compensate for an air flow deficit in an airflow through the first cooling canister or through the second cooling canister.

18. The method of claim 17, wherein the air flow deficit is due to a failure of a fan of a set of fans coupled to the first cooling canister; and
wherein the aligned openings are configured to permit a sufficient quantity of air flow between the second cooling canister and the first cooling canister to compensate for the air flow deficit due to the failure of the fan.

19. The method of claim 18, wherein the fan of the set of fans has a diameter that spans multiple rack slots of the rack when installed in the rack.

20. The method of claim 17, further comprising:
coupling a canister body of a third cooling canister in a third rack position such that air that flows through a set of servers in the third rack position flows through the canister body of the third cooling canister; and
aligning an opening in the canister body of the third cooling canister with another opening in the canister body of the second cooling canister, such that the aligned openings between the second cooling canister and the third cooling canister permit airflow between the third cooling canister and the second cooling canister to compensate for an air flow deficit in an airflow through the third cooling canister or the second cooling canister.

21. The method of claim 17, further comprising:
installing a damper in the opening in the canister body of the first cooling canister or in the opening in the canister body of the second cooling canister, wherein the damper is configured to regulate airflow between the first cooling canister and the second cooling canister.

* * * * *